United States Patent
Osada et al.

(10) Patent No.: US 7,816,238 B2
(45) Date of Patent: Oct. 19, 2010

(54) GAN SUBSTRATE, SUBSTRATE WITH EPITAXIAL LAYER, SEMICONDUCTOR DEVICE, AND METHOD OF MANUFACTURING GAN SUBSTRATE

(75) Inventors: Hideki Osada, Itami (JP); Hitoshi Kasai, Itami (JP); Keiji Ishibashi, Itami (JP); Seiji Nakahata, Itami (JP); Takashi Kyono, Itami (JP); Katsushi Akita, Itami (JP); Yoshiki Miura, Itami (JP)

(73) Assignee: Sumitomo Electric Industries, Ltd., Osaka-shi, Osaka (JP)

( * ) Notice: Subject to any disclaimer, the term of this patent is extended or adjusted under 35 U.S.C. 154(b) by 0 days.

(21) Appl. No.: 12/137,038

(22) Filed: Jun. 11, 2008

(65) Prior Publication Data
US 2008/0308906 A1    Dec. 18, 2008

(30) Foreign Application Priority Data

Jun. 14, 2007 (JP) .............................. 2007-157784
Nov. 30, 2007 (JP) .............................. 2007-310760
Dec. 28, 2007 (JP) .............................. 2007-340635

(51) Int. Cl.
*H01L 21/20* (2006.01)
(52) U.S. Cl. ..................... 438/503; 438/507; 438/945; 438/973; 257/E21.097
(58) Field of Classification Search ................. 438/503, 438/507, 945, 973; 257/E21.097
See application file for complete search history.

(56) References Cited

U.S. PATENT DOCUMENTS

2005/0208687 A1* 9/2005 Kasai et al. .................... 438/22
2006/0043419 A1* 3/2006 Tachibana et al. ........... 257/200

(Continued)

FOREIGN PATENT DOCUMENTS

EP    1 304 749    4/2003

(Continued)

OTHER PUBLICATIONS

"News Release: Succeeded in LED Development on Semipolar Plane Bulk GaN Substrate", Japanese Journal of Applied Physics, Jun. 30, 2006, Published by Kyoto University; and partial translation thereof.

(Continued)

*Primary Examiner*—Zandra Smith
*Assistant Examiner*—Christy L Novacek
(74) *Attorney, Agent, or Firm*—Drinker Biddle & Reath LLP

(57) ABSTRACT

A GaN substrate having a large diameter of two inches or more by which a semiconductor device such as a light emitting element with improved characteristics such as luminance efficiency, an operating life and the like can be obtained at low cost industrially, a substrate having an epitaxial layer formed on the GaN substrate, a semiconductor device, and a method of manufacturing the GaN substrate are provided. A GaN substrate has a main surface and contains a low-defect crystal region and a defect concentrated region adjacent to low-defect crystal region. Low-defect crystal region and defect concentrated region extend from the main surface to a back surface positioned on the opposite side of the main surface. A plane direction [0001] is inclined in an off-angle direction with respect to a normal vector of the main surface.

8 Claims, 7 Drawing Sheets

U.S. PATENT DOCUMENTS

2006/0086948 A1* 4/2006 Ohno et al. .................. 257/103
2006/0154451 A1   7/2006 Park

FOREIGN PATENT DOCUMENTS

| EP | 1 630 878     | 3/2006  |
|----|---------------|---------|
| JP | 2003-60318    | 2/2003  |
| JP | 2003-183100   | 7/2003  |
| JP | 2003-238297   | 8/2003  |
| JP | 2005-298319   | 10/2005 |

OTHER PUBLICATIONS

Bruckner et al., "High Quality GaN Layers Grown on Slightly Miscut Sapphire Wafers", Materials Research Society Symposium Proceedings, vol. 892, 2006, pp. 1-6.

Tuomisto et al., "Effect of Growth Polarity on Vacancy Defect and Impurity Incorporation in Dislocation-free GaN", Applied Physics Letters, vol. 86, 2005, pp. 031915-1-031915-3.

Tengborn et al., "Effect of the Misorientation of the 4$H$-SiC Substrate on the Open Volume Defects in GaN Grown by Metal-Organic Chemical Vapor Deposition", Applied Physics Letters, vol. 89, 2006; pp. 091905-1-091905-3.

* cited by examiner

GAN SUBSTRATE, SUBSTRATE WITH EPITAXIAL LAYER, SEMICONDUCTOR DEVICE, AND METHOD OF MANUFACTURING GAN SUBSTRATE

BACKGROUND OF THE INVENTION

1. Field of the Invention

The present invention relates to a GaN substrate, a substrate with an epitaxial layer, a semiconductor device, and a method of manufacturing the GaN substrate, and more particularly, to a GaN substrate, a substrate with a epitaxial layer, a semiconductor device and a method of manufacturing the GaN substrate capable of making use of a semipolar plane.

2. Description of the Related Art

Conventionally, a GaN-based laser diode (LD) and a GaN-based light emitting diode (LED) have been known. The GaN-based LD and LED have been formed by depositing an epitaxial layer on a (0001) plane of a sapphire substrate, a SiC substrate, or a GaN substrate. Since the (0001) plane of the above GaN substrate, for example, is a polar plane, there has been a problem that the luminance efficiency of the LED is lowered in a long-wavelength region having an emission wavelength of 500 nm or more.

To solve the above problem, it is reported that the luminance efficiency in the above long-wavelength region is improved by forming a quantum well structure on a semipolar crystal plane such as a (11-22) plane instead of the conventional (0001) plane in a GaN crystal (refer to "News Release: Succeeded in LED development on semipolar-plane bulk GaN substrate"), [online], Jun. 30, 2006, Kyoto University [retrieved Jun. 1, 2007], Internet (http://www.kyoto-u.ac.jp/notice/05_news/documents/060630_1.htm) (Non-patent Document 1)). In addition, a method of manufacturing a GaN substrate in which such a semipolar crystal plane is exposed to a main surface has been proposed (refer to Japanese Patent Laying-Open No. 2005-298319 (Patent Document 1).

In addition, in order to improve the operating life and performance of a light emitting element such as a GaN-based LED, it is proposed to form a defect concentrated region in which a defect such as dislocation is collected in a GaN crystal to reduce a defect density of a region around the defect concentrated region (refer to Japanese Patent Laying-Open No. 2003-183100 (Patent Document 2)).

According to an LED disclosed in the above Non-patent Document 1, a semipolar crystal plane formed naturally as a microfacet is used, and the crystal plane is fixed to the (11-20) plane and small in size. However, in view of efficient manufacturing of LEDs and LDs, it is preferable to manufacture an LED and the like with a GaN substrate having a large diameter of 2 inches or more in which a semipolar crystal plane is exposed to a main surface (that is, a predetermined plane direction ([0001] direction, for example) is inclined in a predetermined direction at a predetermined angle, that is, has an off-angle with respect to a normal vector of the main surface). In addition, when the value of the inclined angle of the plane direction with respect to the normal vector of the main surface is adjusted (that is, when the crystal plane exposed to the main surface of the substrate is changed), it is considered that the characteristics of the LED and LD can be improved. Thus, when the GaN substrate in which the above-described defect concentrated region is formed and the defect density of another region is reduced is used, and the value of the inclined angle of the plane direction with respect to the normal vector of the main surface is adjusted as described above, it is considered that the characteristics of the LED and LD can be improved.

SUMMARY OF THE INVENTION

It is an object of the present invention to provide a GaN substrate having a large diameter of 2 inches or more to industrially provide a semiconductor device such as a light emitting element with improved characteristics such as luminance efficiency, an operating life and the like at low cost, a substrate having an epitaxial layer formed on a main surface of the GaN substrate, a semiconductor device, and a method of manufacturing the GaN substrate.

The inventors have produced a GaN substrate having various off-angles in which a defect concentrated region is formed and a defect density is reduced in a region other than the defect concentrated region, based on the above manufacturing methods of a GaN substrate shown in Patent Document 1 and Patent Document 2, and made a prototype LED by forming an epitaxial layer on the main surface of the GaN substrate, and examined its characteristics. As a result, when a plane direction [0001] is inclined in one plane direction (one off-angle direction) with respect to the normal vector of the main surface, the crystal plane exposed to the surface of the GaN substrate can be a semipolar plane. Also, when the plane direction [0001] is further inclined in another plane direction (another off-angle direction), it has been found that variation in wavelength distribution in the main surface of the GaN substrate can be controlled (reduced). That is, a GaN substrate according to the present invention has a main surface and includes a low-defect crystal region and a defect concentrated region adjacent to the low-defect crystal region. The low-defect crystal region and the defect concentrated region extend from the main surface to a back surface positioned on the opposite side of the main surface. A plane direction [0001] is inclined in an off-angle direction with respect to a normal vector of the main surface.

Thus, when the plane direction (Miller Index) [0001] is inclined in the first off-angle direction, the main surface of the GaN substrate having the low-defect crystal region becomes a semipolar plane, and an epitaxial layer can be formed on the main surface. Therefore, as compared with the case where a light emitting element such as an LED is manufactured by forming an epitaxial layer on a polar plane of the (0001) plane of the GaN substrate, characteristics such as an operating life can be improved, the luminance efficiency of a light emitting element having an emission wavelength contained in a long-wavelength region of 500 nm or more is improved, and a wavelength shift amount due to change in an applied current amount can be reduced. As a result, when the above GaN substrate is used, a semiconductor device such as a light emitting element having excellent characteristics can be manufactured stably.

A substrate with an epitaxial layer according to the present invention has the above-described GaN substrate and an epitaxially grown layer formed on the main surface of the GaN substrate. With this structure, since the epitaxially grown layer is formed on the semipolar plane of the GaN substrate, there can be provided a substrate with an epitaxial layer that allows a semiconductor device such as a light emitting element in which an emission wavelength is contained in a long-wavelength region having an emission wavelength of 500 nm or more, characteristics such as an operating life are improved, and luminance efficiency is improved to be stably manufactured.

A semiconductor device according to the present invention uses the substrate with an epitaxial layer. In this case, a semiconductor device such as a light emitting element in which an emission wavelength is contained in a long-wavelength region of 500 nm or more, characteristics such as an operating life are improved, luminance efficiency is improved, and a wavelength shift amount due to an applied current amount is reduced can be provided.

A method of manufacturing the GaN substrate according to the present invention includes the following steps. That is, a base substrate in which a reference plane direction is inclined in an inclined direction of the base substrate with respect to a normal vector of the main surface is prepared. A mask layer having a pattern is formed on the main surface of the base substrate. A GaN crystal layer is grown on the main surface of the base substrate on which the mask layer is formed. The GaN substrate containing the GaN crystal layer is provided by removing the base substrate from the GaN crystal layer. The GaN substrate has the main surface and the plane direction [0001] thereof is inclined in an off-angle direction with respect to the normal vector of the main surface. When the inclined angle of the reference plane direction in the inclined direction of the base substrate in the base substrate is changed, the inclined angle of plane direction [0001] in the off-angle direction in the GaN substrate can be adjusted. Thus, the GaN substrate according to the present invention in which the defect concentrated region is formed on the mask layer and the low-defect crystal region having a low defect density is formed between the defect concentrated regions can be easily provided. In addition, the GaN substrate in which the inclined angle in the off-angle direction of the GaN substrate can be optionally changed by changing the inclined angle of the reference plane direction of the base substrate in the inclined direction of the base substrate can be easily manufactured.

The present invention provides a GaN substrate, a substrate with an epitaxial layer, a semiconductor device, and a method of manufacturing the GaN substrate with which a semiconductor device such as a light emitting element having improved characteristics such as an operating life and improved luminance efficiency in a long-wavelength region having an emission wavelength of 500 nm or more can be stably manufactured.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
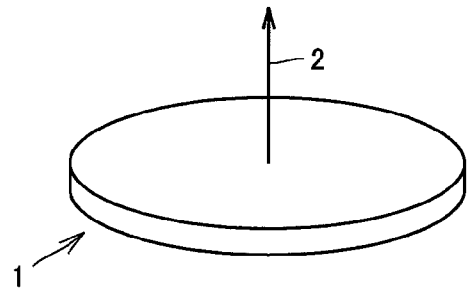
FIG. 1 is a perspective schematic view showing a GaN substrate according to the present invention.

Embodiments of the present invention will be described with reference to the drawings hereinafter. The same reference numerals are allotted to the same or corresponding parts in the following drawings, and its description will not be repeated.

Referring to FIGS. 1 to 6, a GaN substrate according to the present invention will be described.

Figure 2:
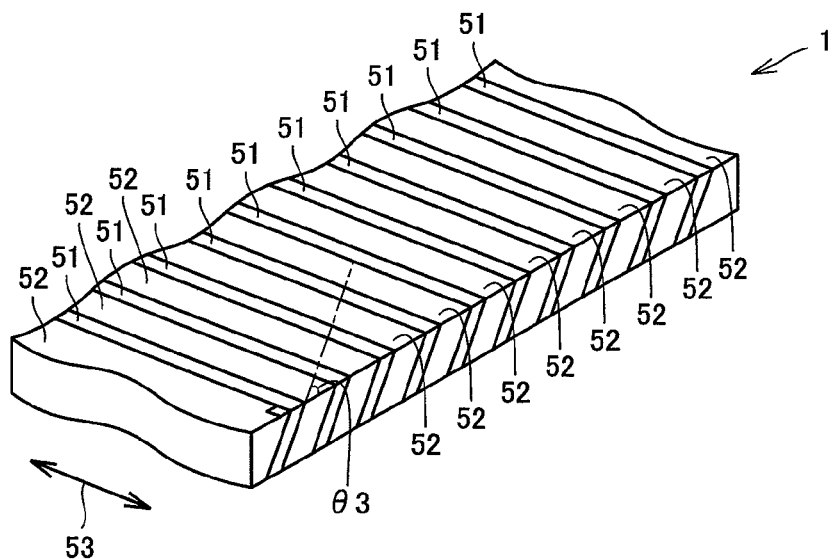
FIG. 2 is an enlarged schematic view for describing the structure of the GaN substrate shown in FIG. 1.

Referring to FIGS. 1 to 6, in a GaN substrate 1 according to the present invention, a specific plane direction (a plane direction [0001] herein) is inclined in two different directions (off-angle directions) with respect to a normal vector 2 (refer to FIG. 1) of its main surface. That is, GaN substrate 1 has an off-angle in which the plane direction [0001] is inclined in one plane direction or two different directions. In addition, as shown in FIG. 2, GaN substrate 1 according to the present invention is composed of a defect concentrated region 51 and a low-defect crystal region 52. The plurality of defect concentrated regions 51 extending linearly are formed parallel to one another at intervals in GaN substrate 1. The plurality of low-defect crystal regions 52 are formed so as to extend in the same direction as the extending direction of defect concentrated regions 51, between defect concentrated regions 51. A crossing angle θ3 of defect concentrated region 51 formed so as to penetrate GaN substrate 1 in the thickness direction, with respect to the main surface of GaN substrate 1 is smaller than 90°. This is because GaN substrate 1 is formed such that the growth direction of defect concentrated region 51 (extending direction of defect concentrated region 51 in the thickness direction of GaN substrate 1) maintains a predetermined relation with the plane direction [0001] of GaN substrate 1.

The crossing angle θ3 is an angle formed between a line perpendicular to the extending direction of defect concentrated region 51 (shown by an arrow 53 in FIG. 2) and the extending direction of defect concentrated region 51 in the thickness direction of GaN substrate 1.

Figure 3:
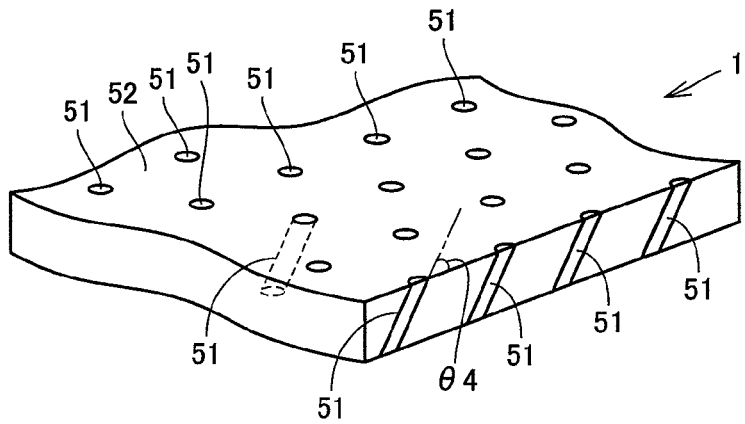
FIG. 3 is an enlarged schematic view for describing another example of the structure of the GaN substrate shown in FIG. 1.

In addition, the configurations of defect concentrated region 51 and low-defect crystal region 52 in GaN substrate 1 are not limited to the ones shown in FIG. 2, and they may be the ones shown in FIG. 3, for example. According to GaN substrate 1 shown in FIG. 3, the plurality of defect concentrated regions 51 are dispersed in the form of islands on the main surface, and low-defect crystal region 52 is formed between defect concentrated regions 51. To put it differently, defect concentrated regions 51 are disposed in a dispersed fashion in low-defect crystal region 52. Thus, defect concentrated region 51 is formed so as to extend from the main surface to the back surface of GaN substrate 1 (penetrate GaN substrate 1 in the thickness direction thereof. In GaN substrate 1 shown in FIG. 3 also, a crossing angle θ4 of the extending direction of defect concentrated region 51 with respect to the main surface of GaN substrate 1 is smaller than 90°. The cross angle θ4 is the smallest angle among angles formed between lines parallel to the extending direction of defect concentrated region 51 in the thickness direction of GaN substrate 1 and the main surface of GaN substrate 1.

Figure 4:
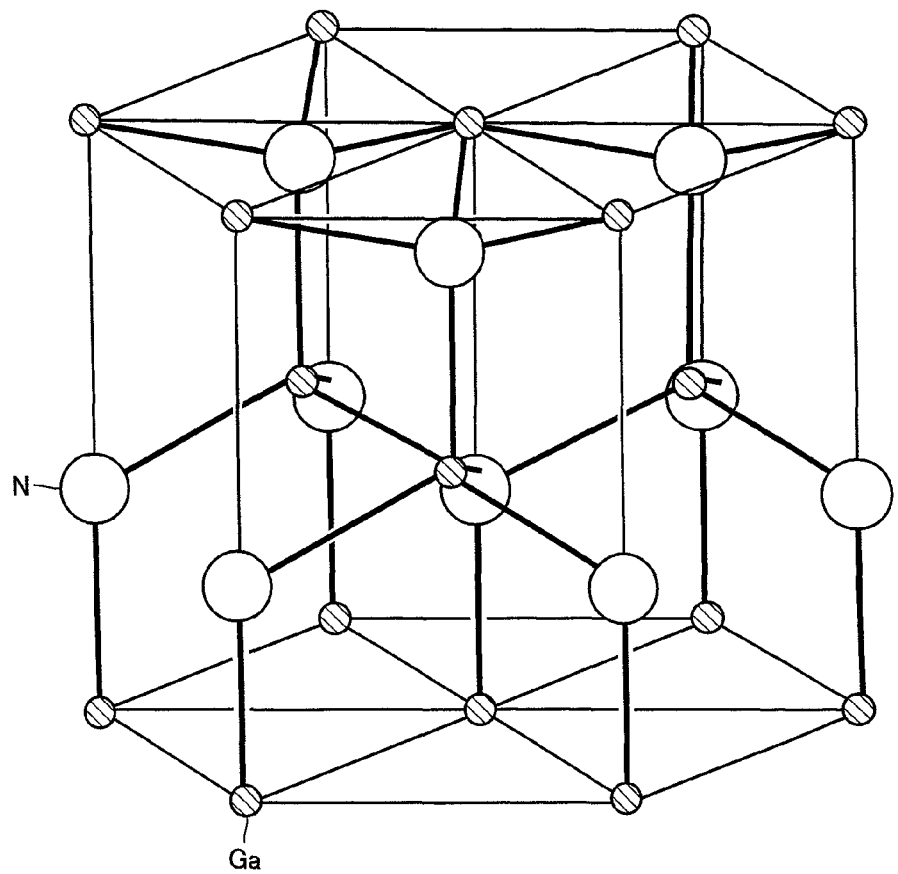
FIG. 4 is a schematic view for describing the crystal structure of the GaN substrate shown in FIG. 1.

As shown in FIG. 4, the crystal structure of GaN has a so-called hexagonal crystal structure. In FIG. 4, the GaN crystal structure is shown with a plurality of cells to facilitate understanding of the symmetry property of the hexagonal crystal structure of GaN. Referring to FIG. 4, a large white ball designates a nitrogen atom (N atom) and a small ball designates a gallium atom (Ga atom). A Ga atom exists at the center and around the Ga atom, other Ga atoms are located at the apexes of a regular hexagon in the bottom plane of the crystal structure shown in FIG. 4. Directions connecting the Ga atom located at the center in the bottom plane to other surrounding six Ga atoms are [2-1-10], [11-20], [-12-10], [-2110], [-1-120], and [1-210] counterclockwise. These directions are directions of Ga—Ga bonding of GaN. Thus, the direction in which a Ga atom does not exist when viewed from the center Ga atom in the bottom plane is [1-100] and the like. In the crystal structure shown in FIGS. 4 and 5, the upper plane of the hexagonal crystal that can be regarded as a regular hexagonal prism is referred to as a c-plane and a side wall plane of the regular hexagonal prism is referred to as an m-plane.

Figure 6:
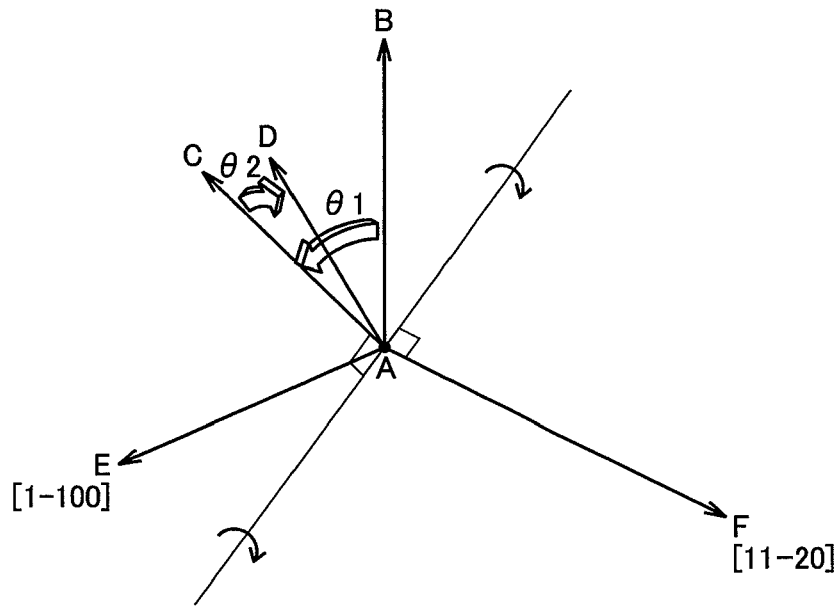
FIG. 6 is a schematic view for describing an inclined angle in an off-angle direction of the GaN substrate according to the present invention shown in FIG. 1.

In GaN substrate 1 according to the present invention shown in FIG. 1, the plane direction [0001] is inclined to the plane directions [1-100] and the plane direction [11-20] that are two different off-angle directions with respect to normal vector 2 (refer to FIG. 1). With reference to FIG. 6, the inclined state of the plane direction [0001] with respect to normal vector 2 of the main surface of GaN substrate 1 will be described in more detail.

First, referring to FIG. 6, it is assumed that the direction shown by a vector AB corresponds to normal vector 2 (refer to FIG. 1) of the main surface of the GaN substrate. Then, the GaN crystal is inclined such that the plane direction [0001] is inclined toward a vector AE corresponding to the direction of the plane direction [1-100] by an inclination angle of θ1 from the condition in which vector AB coincides with the plane direction [0001] of the GaN substrate. As a result, the direction of the plane direction [0001] of GaN becomes the direction shown by a vector AC. Then, the GaN crystal structure inclined in the direction shown by vector AC is further inclined in the direction of a vector AF corresponding to the plane direction [11-20] by an inclination angle of θ2. As a result, the plane direction [0001] of the GaN crystal is in the direction shown by a vector AD in FIG. 6.

Thus, in GaN substrate 1 according to the present invention, the direction of the plane direction [0001] of the crystal is inclined in the direction shown by vector AD in FIG. 6 with respect to normal vector 2 (refer to FIG. 1) of the main surface shown by vector AB (the plane direction [0001] is inclined in the plane direction [1-100] and the plane direction [11-20] with respect to normal vector 2 of the main surface by the inclination angles of θ1 and θ2.

In addition, in GaN substrate 1 according to the present invention, the plane direction [0001] of the crystal may be inclined in the direction shown by vector AC in FIG. 6 with respect to normal vector 2 (refer to FIG. 1) of the main surface shown by vector AB (the plane direction [0001] may be inclined only in the plane direction [1-100] with respect to normal vector 2 of the main surface).

Thus, in GaN substrate 1 according to the present invention, the main surface is a semipolar plane. When a layer of GaN or InGaN is epitaxially grown on the main surface of such GaN substrate 1 and a light emitting element is formed as a semiconductor device, an internal electric field is prevented from being generated in an active layer as compared with the case where a light emitting element is manufactured by forming an epitaxial layer on the c-plane of GaN. As a result, the problem of reduction in recombination rate between an electron supplied to the active layer and a positive hole due to the generation of the internal electric field, accordingly causing low luminance efficiency and fluctuation in emission wavelength due to change in an applied current can be attenuated. Therefore, the light emitting element can have high luminance efficiency and a constant emission wavelength.

In addition, in GaN substrate 1 according to the present invention, it is preferable that the extending direction of defect concentrated region 51 shown by arrow 53 in FIG. 2 and the inclined direction of the crystal plane direction [0001] are such that the extending direction of defect concentrated region 51 corresponds to the [1-100] direction, and the inclined direction of the crystal plane direction [0001] corresponds to the [11-20] direction. In this case, when cleavage is provided on the (1-100) plane at the time of manufacturing an LD, opposed cleavage planes are parallel to each other, which is preferable when a laser resonance plane is produced.

Figure 7:
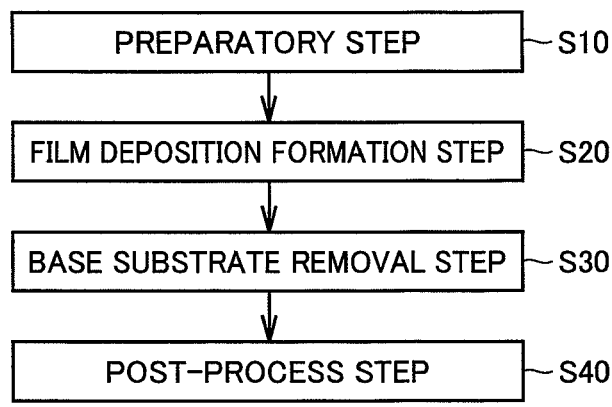
FIG. 7 is a flowchart for describing a manufacturing method of the GaN substrate shown in FIG. 1.
Figure 8:
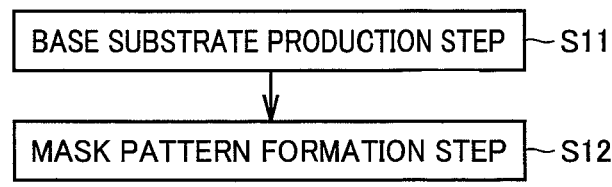
FIG. 8 is a flowchart for describing the contents of a preparation step in the flowchart shown in FIG. 7.

With reference to FIGS. 7 and 8, a method of manufacturing the GaN substrate according to the present invention will be described.

Referring to FIGS. 7 and 8, a preparatory step (S10) is performed first. In preparatory step (S10), a base substrate serving as a base to form an GaN epitaxial layer to be the GaN substrate is prepared. More specifically, as shown in FIG. 8, in preparatory step (S10) (refer to FIG. 7), base substrate production step (S11) is performed first. In this base substrate production step (S11), a substrate on which GaN can be epitaxially grown and in which a specific plane direction is inclined in two different directions (inclined direction of the base substrate) with respect to the normal vector of the main surface on which GaN will be epitaxially grown is prepared. Note that the inclined direction of the specific plane direction with respect to the normal vector of the main surface may be one direction.

The base substrate can be formed of any material as long as GaN can be grown on its surface. The base substrate includes a gallium arsenic (GaAs) substrate, a sapphire substrate, a zinc oxide (ZnO) substrate, a silicon carbide (SiC) substrate, and a GaN substrate. The base substrate has an off-angle so that in a film formation step that will be described later, the GaN epitaxial layer can be grown while the plane direction [0001] of the GaN epitaxial layer to be formed is inclined in a predetermined direction (two off-angle directions or one off-angle direction) with respect to the normal vector of the main surface of the base substrate on which the GaN epitaxial layer is formed. More specifically, in the base substrate, a predetermined reference plane direction is inclined in a predetermined direction with respect to the normal vector of the main surface on which the epitaxial layer will be formed. This kind of substrate can be provided by preparing a substrate in which its main surface is a specific crystal plane (such as c-plane in the case of a hexagonal crystal) and grinding the main surface of the substrate at an angle inclined in the predetermined direction with respect to the main surface of the substrate or cutting the base substrate from a bulk substrate in which the plane direction of the crystal with respect to the main surface is known, at a predetermined cut angle.

Figure 9:
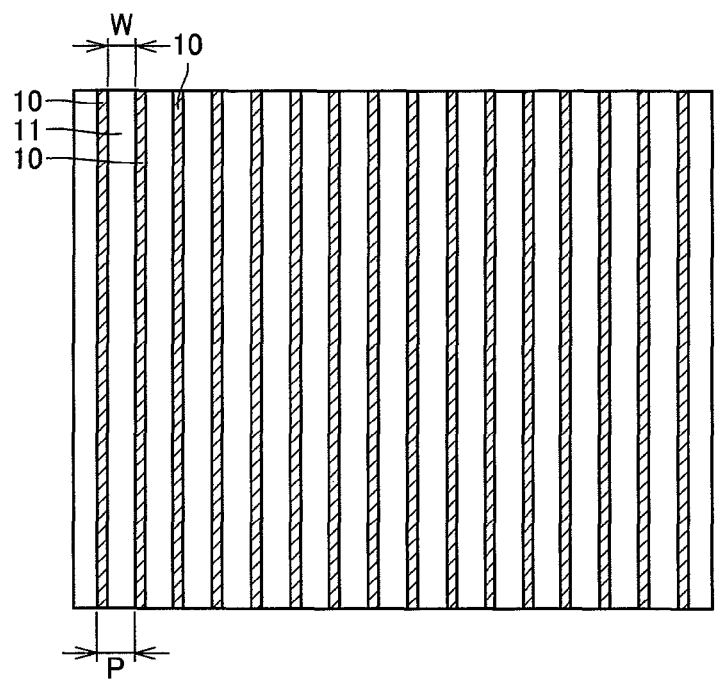
FIG. 9 is a plan schematic view showing a mask pattern of a mask layer formed on a main surface of a base substrate.

Then, as shown in FIG. 8, a mask pattern formation step (S12) is performed. In this mask pattern formation step (S12), a mask pattern to be used to form a defect concentrated region on the main surface of the base substrate on which the GaN epitaxial layer will be formed is formed. More specifically, a mask layer 10 having a pattern shown in FIG. 9 or 10 is formed.

First, the mask pattern shown in FIG. 9 will be described. As shown in FIG. 9, mask layer 10 to be formed on the main surface of the base substrate may be formed such that line patterns each having a width of W1 extend parallel to one another with a pitch of P. At this time, pitch P may be 600 μm, width W1 of the line pattern is 50 μm, and an interval W2 between the line patterns (a width of a groove-shaped opening 11 formed between the line patterns) may be 550 μm, for example. In addition, a thickness of the line pattern may be 0.1 μm, for example.

Figure 10:
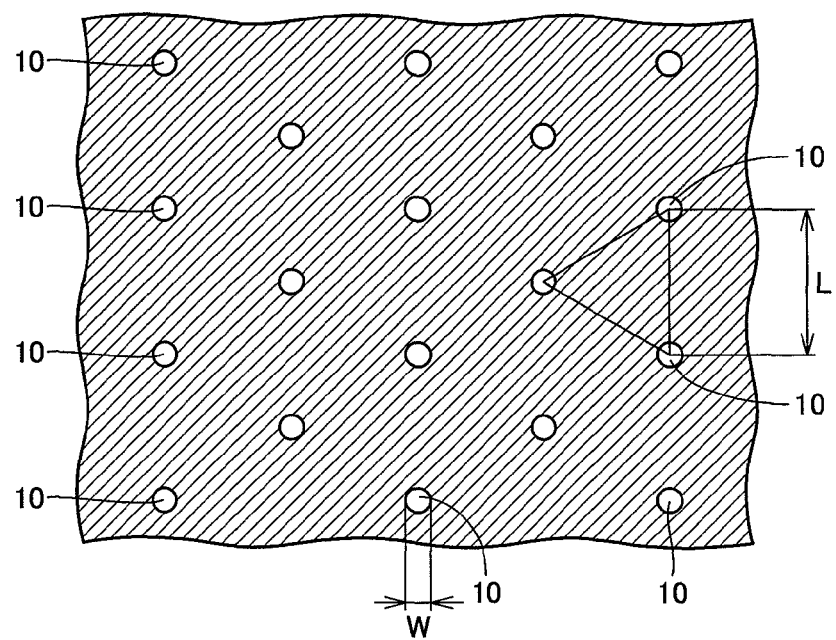
FIG. 10 is a plan schematic view showing a mask pattern of a mask layer formed on the main surface of the base substrate.

In addition, as shown in FIG. 10 as another mask pattern example, mask layers 10 each having, e.g., a circle plan configuration are dispersed and disposed in the form of islands on the main surface of the base substrate. More specifically, a diameter W of mask layer 10 in the shape of an island may be, e.g., 50 μm, and a distance L between centers of adjacent mask layers 10 may be, e.g., 600 μm. The plurality of mask layers 10 in the form of islands are disposed in the forms of a so-called houndstooth check, and mask layers 10 may be disposed such that distance L between the central points of adjacent mask layers 10 forms one side of a regular triangle. Alternatively, the plurality of mask layers 10 in the form of islands may be disposed such that distance L between the central points of adjacent mask layers 10 forms one side of a regular rectangle. In addition, the plan figure of mask layer 10 is not limited to the circle but may take any form.

Figure 5:
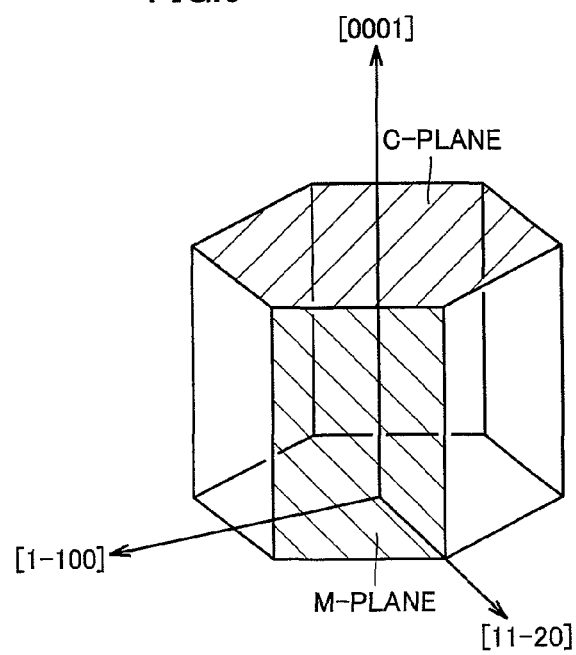
FIG. 5 is a schematic view for describing the plane direction and crystal plane of the crystal structure of the GaN substrate shown in FIG. 4.
Figure 11:
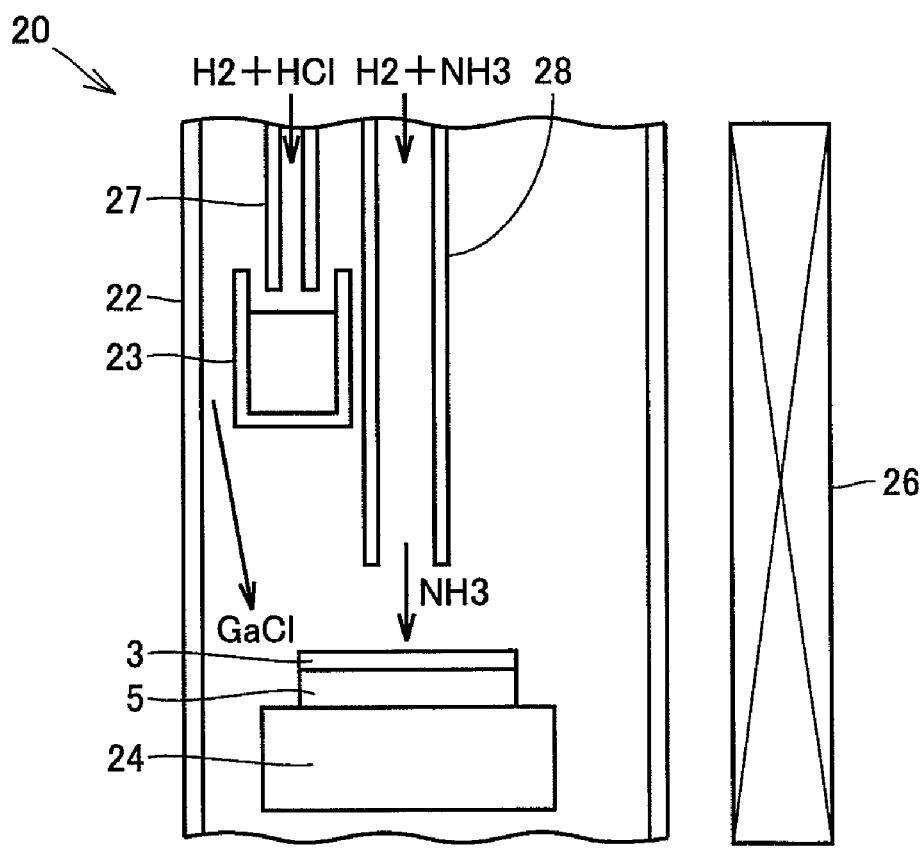
FIG. 11 is a schematic view showing a film formation apparatus used in a film formation step (S20).

As shown in FIG. 5, film formation step (S20) is performed on the base substrate having mask layer 10 formed thereon. More specifically, a GaN thin film is formed on the main surface of the base substrate on which the mask layer is formed by a vapor growth method. The vapor growth method of the GaN thin film includes an HVPE method (Hydride Vapor Phase Epitaxy), a sublimation method, an MOC method (Metallorganic Chloride), and an MOCVD (Metal-organic Chemical Vapor Deposition). In this film formation step (S20), the HVPE method may be used, for example. With reference to FIG. 11, a film formation device using the HVPE method will be described.

As shown in FIG. 11, a film formation apparatus 20 includes a reaction tube 22, a Ga boat 23 set in reaction tube 22, a susceptor 24 for supporting the base substrate in reaction tube 22, and a heater 26 for heating the inside of reaction tube 22. Ga metal is disposed in Ga boat 23. A pipe 27 for supplying hydrogen chloride (HCl) gas diluted with hydrogen, nitrogen, or argon to Ga boat 23 is disposed. In addition, a pipe 28 for supplying ammonium ($NH_3$) gas diluted with hydrogen, nitrogen, or argon is disposed above susceptor 24. Heater 26 for heating reaction tube 22 is disposed at a position opposed to the outer circumference of reaction tube 22. A base substrate 5 is set on susceptor 24. A GaN crystal layer 3 is formed on base substrate 5 as will be described later.

Next, a method of manufacturing GaN crystal layer 3 by film formation apparatus 20 shown in FIG. 11 will be described. First, base substrate 5 is set on susceptor 24 in reaction tube 22 of film formation device 20 shown in FIG. 11. Then, Ga boat 23 serving as a container having Ga metal inside is disposed above susceptor 24. Then, while the whole apparatus is heated by heater 26, HCl gas diluted with hydrogen, nitrogen, or argon is supplied to Ga boat 23 through pipe 27. As a result, a reaction such that $2Ga+2HCl \rightarrow 2GaCl+H_2$ takes place. GaCl gas generated from the reaction is supplied to base substrate 5.

At the same time, $NH_3$ gas diluted with hydrogen, nitrogen, or argon is supplied in the vicinity of susceptor 24 through pipe 28. Then, a reaction such that $2GaCl+2NH_3=2GaN+3H_2$ takes place in the vicinity of base substrate 5. GaN formed by the reaction is deposited on the plane of heated base substrate 5 as GaN crystal. Thus, GaN crystal layer 3 is formed on the plane of base substrate 5. At this time, GaN crystal layer 3 is formed on mask layer 10 shown in FIG. 9 or 10 on the plane of the base substrate. As a result, dislocation of GaN crystal layer 3 is concentrated on portions positioned on mask layers 10, and stripe-shaped defect concentrated regions 51 (refer to FIG. 2) are formed. Meanwhile, since the defects are concentrated in defect concentrated region 51, a defect density (dislocation density) of low-defect crystal region 52 disposed between defect concentrated regions 51 is reduced.

In addition, since base substrate 5 has a so-called off-angle, a predetermined plane direction of formed GaN crystal layer 3 is also inclined with respect to the normal vector of the plane opposed to the main surface of base substrate 5. In addition, the inclined direction and inclined angle of the predetermined plane direction with respect to the normal vector of GaN crystal layer 3 can be changed based on the inclined direction and inclined angle of the reference plan direction of the base substrate.

GaN crystal layer 3 is formed to be sufficiently thick so that it can stand up by itself and handled after base substrate 5 is removed as will be described later. The thickness of GaN crystal layer 3 can be 10 mm, for example.

Next, as shown in FIG. 7, a base substrate removal step (S30) is performed. In this base substrate removal step (S30), base substrate 5 is removed from formed GaN crystal layer 3. A removal method of base substrate 5 includes a mechanical method such as slicing, a chemical method such as etching, and an electrochemical method such as electrolytical etching. As a result, a GaN substrate having GaN crystal layer 3 can be provided. In addition, in provided GaN substrate 1 (refer to FIG. 1), the plane direction [0001] is inclined in two different off-angle directions with respect to its surface because the reference plane direction of the base substrate is inclined in two directions.

Then, a post-process step (S40) is performed. In post-process step (S40), a polishing step for the substrate plane, slicing step for slicing GaN substrate 1 into a predetermined thickness, and the like may be performed.

Figure 12:
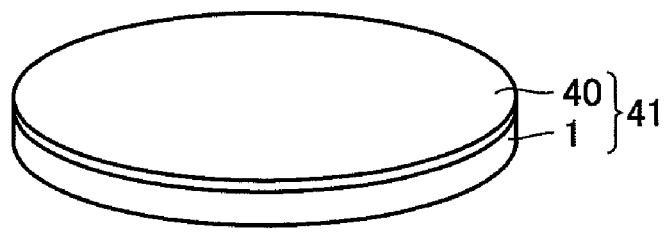
FIG. 12 is a perspective schematic view showing a substrate with an epitaxial layer using the GaN substrate according to the present invention shown in FIG. 1.
Figure 13:
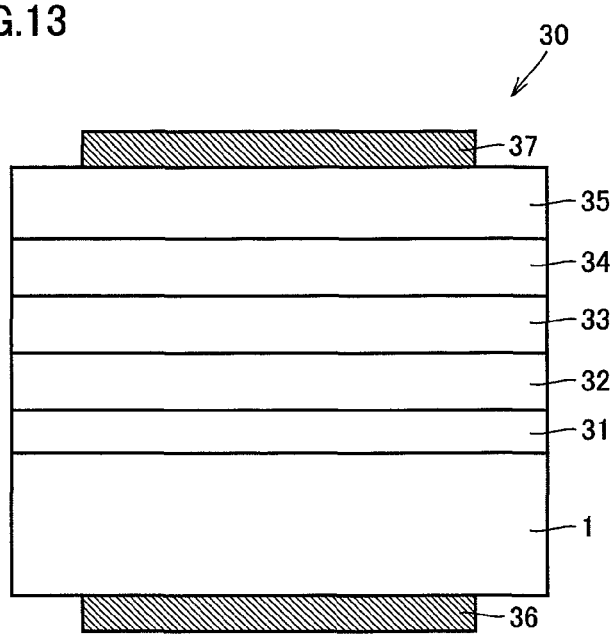
FIG. 13 is a cross-sectional schematic view showing a light emitting element using the GaN substrate according to the present invention.

As shown in FIG. 12, an epitaxial layer 40 of GaN is formed on the plane of GaN substrate 1 produced as described above, whereby a substrate with the epitaxial layer (an epitaxial substrate 41) is provided. In addition, with epitaxial substrate 41, a light emitting element can be formed as shown in FIG. 13. With reference to FIG. 13, the light emitting element using the GaN substrate according to the present invention will be described.

As shown in FIG. 13, in a light emitting element 30 as a semiconductor device, an n-type AlGaN middle layer 31 is formed on GaN substrate 1. An n-type GaN buffer layer 32 is formed on n-type AlGaN middle layer 31. A light emitting layer 33 is formed on n-type GaN buffer layer 32. Light emitting layer 33 is an InGaN/InGaN-MQW layer (multiple quantum well layer), for example. A p-type AlGaN layer 34 is formed on light emitting layer 33. A p-type GaN buffer layer 35 is formed on p-type AlGaN layer 34. An n-electrode 36 is formed on the back surface of GaN substrate 1 (opposite plane of the plane on which n-type AlGaN middle layer 31 is formed). A p-electrode 37 is formed on p-type GaN buffer layer 35.

Thus, when a light emitting element is formed with GaN substrate 1 according to the present invention, since light emitting layer 33 is formed on a so-called semipolar plane of GaN substrate 1, a piezoelectric field in light emitting layer 33 is reduced. Therefore, the luminance efficiency in the light emitting layer is improved and a shift amount of the emission wavelength caused by the applied current amount change can be reduced as compared with the conventional light emitting element in which a light emitting layer is formed on a polar plane of a GaN substrate.

Although there is a partially overlapping part with the above description, the embodiment of the present invention will be described sequentially.

GaN substrate 1 (refer to FIG. 1) according to the present invention has the main surface and contains low-defect crystal region 52 and defect concentrated region 51 adjacent to low-defect crystal region 52 as shown in FIGS. 2 and 3. Low-defect crystal region 52 and defect concentrated region 51 extend from the main surface to the back surface on the opposite side of the main surface. The plane direction [0001] is inclined in the off-angle direction with respect to normal vector 2 of the main surface. Defect concentrated region 51 is formed of a single crystal provided in almost the same direction as that of low-defect crystal region 52 and has a planar defect at a boundary with contacted low-defect crystal region 52, or defect concentrated region 51 is formed of polycrystal and has a crystal grain boundary at a boundary with contacted low-defect crystal region 52, or defect concentrated region 51 is formed of polycrystal and formed of a crystal in which a c-axis is inverted with respect to contacted low-defect crystal region 52. Furthermore, defect concentrated region 51 is grown and extended in almost the same direction as the off-angle of the base substrate as can be seen when the crystal is cut through a plane vertical to an extending direction 53 of defect concentrated region 51 and the section of the crystal is observed.

Thus, when the plane direction [0001] is inclined in the first off-angle direction, epitaxial layer 40 can be formed on the semipolar plane that is the main surface of GaN substrate 1 having the low-defect crystal region. Therefore, as compared with the case where the light emitting element such as an LED is manufactured by forming the epitaxial layer on the polar plane such as the (0001) plane of the GaN substrate, characteristics such as an operating life can be improved, the luminance efficiency of the light emitting element having an emission wavelength contained in a long wavelength region of 500 nm or more can be improved, and a shift amount of the emission wavelength caused by the applied current amount change can be reduced. As a result, a semiconductor device such as a light emitting element having favorable characteristics can be stably manufactured by using the GaN substrate.

In GaN substrate 1, the off-angle direction in which the plane direction [0001] is inclined with respect to normal vector 2 of the main surface may be a [1-100] direction or a [11-20] direction. In this case, since the main surface of GaN substrate 1 having the low-defect crystal region is a semipolar plane, characteristics such as an operating life can be improved, and luminance efficiency in the long wavelength region can be improved in the light emitting element (semiconductor device).

In GaN substrate 1, the inclined angle of the plane direction [0001] in the [1-100] direction or [11-20] direction with respect to normal vector 2 of the main surface may be 2° to 40°. In addition, the inclined angle may be 5° to 40°, more preferably, 18° to 40°, and even more preferably, 25° to 40°. In this case, since the main surface of GaN substrate 1 is a semipolar plane, the luminance efficiency in the long wavelength region can be surely improved in the light emitting element (semiconductor device).

In GaN substrate 1, the plane direction [0001] may be inclined in two different off-angle directions with respect to normal vector 2 of the main surface. In this case, when the plane direction [0001] is inclined to the first off-angle direction (direction shown by vector AE in FIG. 6, for example), epitaxial layer 40 can be formed on the semipolar plane, that is, on the main surface of GaN substrate 1 having low-defect crystal region 52 (refer to FIGS. 2 and 3). Thus, as compared with the case where a light emitting element such as an LED is manufactured by forming epitaxial layer 40 on a polar plane such as the (0001) plane of GaN substrate 1, characteristics such as an operating life can be improved, luminance efficiency can be improved in the light emitting element having an emission wavelength contained in the long wavelength region of 500 nm or more, and the shift amount of the emission wavelength due to the change in applied current amount can be reduced. Furthermore, when the plane direction [0001] is further inclined in the second off-angle direction (direction shown by vector AF in FIG. 6, for example), variation in off-angle distribution and in-plane wavelength distribution on the main surface of GaN substrate 1 can be controlled. Furthermore, the back surface of the GaN substrate has almost the same off-angle as the main surface. As a result, the contact property of the electrodes formed on the main surface and back surface is improved, and the increase amount of the operation voltage from the start of the operation can be reduced. As a result, a semiconductor device such as a light emitting element having favorable characteristics can be stably manufactured with GaN substrate 1.

The two off-angle directions in which the plane direction [0001] is inclined with respect to normal vector 2 of the main surface of GaN substrate 1 may be the [1-100] direction and [11-20] direction as shown in FIG. 6. In this case, as the main surface of GaN substrate 1 is a semipolar plane, the luminance efficiency in the long wavelength region is improved in the light emitting element (semiconductor device), and the variation in in-plane wavelength distribution generated when epitaxial layer 40 is formed on the main surface of GaN substrate 1 can be surely controlled.

One of inclined angle θ1 in the [1-100] direction and the inclined angle θ2 in the [11-20] direction of the plane direction [0001] with respect to normal vector 2 of the main surface of GaN substrate 1 (refer to FIG. 6) may be 10° to 40°, and the other may be 0.02° to 40°. In addition, one of the two inclined angles may be 10° to 40°, and the other may be 0.02° to 10°. In this case, as the main surface of GaN substrate 1 is a semipolar plane, the luminance efficiency in the long wavelength region is improved in the light emitting element (semiconductor device), and the variation in in-plane wavelength distribution generated when epitaxial layer 40 is formed on the main surface of GaN substrate 1 can be surely reduced.

In GaN substrate 1, defect concentrated regions 51 on the main surface may linearly extend in parallel to one another, and low-defect crystal region 52 may be formed between defect concentrated regions 51 as shown in FIG. 2. In this case, since defect concentrated region 51 and low-defect crystal region 52 are alternately arranged, the defect of low-defect crystal region 52 can be surely concentrated in defect concentrated region 51. Thus, the defect density of low-defect crystal region 52 can be sufficiently reduced.

In GaN substrate 1, defect concentrated regions 51 of the main surface may be dispersed and disposed in the form of islands at intervals, and low-defect crystal region 52 may be formed so as to surround defect concentrated regions 51 as shown in FIG. 3. In this case, since defect concentrated regions 51 are dispersed and disposed in low-defect crystal region 52, the defect of low-defect crystal region 52 can be surely concentrated in defect concentrated region 51. Thus, the defect density of low-defect crystal region 52 can be sufficiently reduced.

The substrate with an epitaxial layer (epitaxial substrate 41) (refer to FIG. 12) according to the present invention has GaN substrate 1, and epitaxial layer 40 as an epitaxial growth layer formed on the main surface of GaN substrate 1. Thus, since epitaxial layer 40 is formed on the semipolar plane of GaN substrate 1, there can be provided epitaxial substrate 41 that allows a semiconductor device such as a light emitting element having the emission wavelength contained in a long wavelength region of 500 nm or more and having the improved characteristics such as an operating life and the improved luminance efficiency to be stably manufactured.

The semiconductor device (light emitting element) according to the present invention is manufactured with epitaxial substrate 41. In this case, of the semiconductor device such as a light emitting element having the emission wavelength contained in a long wavelength region of 500 nm or more, the characteristics such as an operating life can be improved and at the same time, the luminance efficiency is improved and the wavelength shift amount due to the applied current amount can be reduced.

The method of manufacturing the GaN substrate according to the present invention includes the following steps. That is, the step of preparing the base substrate in which the reference plane direction is inclined in the inclined direction of the base substrate with respect to the normal vector of the main surface (base substrate production step (S11)) is performed. The step of forming mask layer 10 having a pattern on the main surface of base substrate 5 (mask pattern formation step (S12)) is performed. The step of growing GaN crystal layer 3 on the main surface of base substrate 5 on which mask layer 10 is formed (film formation step (S20)) is performed. By removing base substrate 5 from GaN crystal layer 3, the step of producing GaN substrate 1 containing GaN crystal layer 3 (base substrate removal step (S30)) is performed. GaN substrate 1 has the main surface and its plane direction [0001] is inclined in the off-angle direction with respect to normal vector 2 of the main surface. When the inclined angle of the reference plane direction of base substrate 5 in the inclined direction of the base substrate is changed, the inclined angle of the plane direction [0001] of GaN substrate 1 in the off-angle direction can be adjusted. Thus, GaN substrate 1 according to the present invention in which defect concentrated regions 51 are formed on mask layer 10 and low-defect crystal region 52 that is low in defect density is formed among defect concentrated regions 51 can be easily provided. In addition, by changing the inclined angle of the reference plane direction of base substrate 5 in the inclined direction of the base substrate, GaN substrate 1 in which the inclined angle in the off-angle direction of GaN substrate 1 can be optionally changed can be easily manufactured.

According to the manufacturing method of the GaN substrate, base substrate 5 may be a GaAs substrate and the reference plane direction may be [111]. The inclined direction of the base substrate may be <1-10> direction or <11-2> direction. The off-angle direction of GaN substrate 1 may be [11-20] direction or [1-100] direction. In this case, since GaN substrate 1 according to the present invention can be manufactured using the relatively easily available GaAs substrate as the base substrate, the manufacturing cost of the GaN substrate can be reduced.

According to the manufacturing method of the GaN substrate, base substrate 5 may be a sapphire substrate, and the reference plane direction may be [0001]. The inclined direction of the base substrate may be [11-20] direction or [1-100] direction. The off-angle direction of GaN substrate 1 may be [1-100] direction or [11-20] direction. In this case, since GaN substrate 1 according to the present invention can be manufactured using the relatively easily available sapphire substrate as base substrate 5, the manufacturing cost of GaN substrate 1 can be reduced.

According to the manufacturing method of the GaN substrate, base substrate 5 may be a ZnO substrate, and the reference plane direction may be [0001]. The inclined direction of the base substrate may be [1-100] direction or [11-20] direction. The off-angle direction of GaN substrate 1 may be [1-100] direction or [11-20] direction. In this case, since GaN substrate 1 according to the present invention can be manufactured using the relatively easily available ZnO substrate as base substrate 5, the manufacturing cost of GaN substrate 1 can be reduced.

According to the manufacturing method of the GaN substrate, base substrate 5 may be a SiC substrate, and the reference plane direction may be [0001]. The inclined direction of the base substrate may be [1-100] direction or [11-20] direction. The off-angle direction of GaN substrate 1 may be [1-100] direction or [11-20] direction. In this case, since GaN substrate 1 according to the present invention can be manufactured using the relatively easily available SiC substrate as base substrate 5, the manufacturing cost of GaN substrate 1 can be reduced.

According to the manufacturing method of the GaN substrate, base substrate 5 may be a GaN-based substrate, and the reference plane direction may be [0001]. The inclined direction of the base substrate may be [1-100] direction or [11-20] direction. The off-angle direction of GaN substrate 1 may be [1-100] direction or [11-20] direction. In this case, since, as base substrate 5 on which GaN crystal layer 3 to be GaN substrate 1 is formed, the substrate is formed of the same material of GaN, the film quality of GaN crystal layer 3 can be improved, and GaN substrate 1 is favorable in film quality.

According to the manufacturing method of the GaN substrate, the inclined angle of base substrate 5 in the inclined direction of the base substrate may be 2° to 40°. In this case, the inclined angle of GaN substrate 1 to be formed in the off-angle direction can be adjusted to be 2° to 40°.

According to the manufacturing method of the GaN substrate, in the step of preparing base substrate 5 (base substrate production step (S11)), the reference plane direction may be inclined in two different inclined directions of the base substrate with respect to the normal vector of the main surface. In GaN substrate 1, the plane direction [0001] may be inclined in two different off-angle directions with respect to normal vector 2 of the main surface. The two directions of base substrate 5 toward the base substrate may be orthogonal to each other. In addition, the two off-angle directions of GaN substrate 1 may be orthogonal to each other. In this case, GaN substrate 1 according to the present invention in which the plane direction [0001] is inclined in two different off-angle directions with respect to normal vector 2 of the main surface can be easily provided.

According to the manufacturing method of the GaN substrate, base substrate 5 may be a GaAs substrate, and the reference plane direction may be [111]. The two inclined directions of the base substrate may be <1-10> direction and <11-2> direction. The two off-angle directions of GaN substrate 1 may be [11-20] direction and [1-100] direction. In this case, since GaN substrate 1 according to the present invention can be manufactured using the relatively easily available GaAs substrate as base substrate 5, the manufacturing cost of GaN substrate 1 can be reduced.

According to the manufacturing method of the GaN substrate, base substrate 5 may be a sapphire substrate, and the reference plane direction may be [0001]. The two inclined directions of the base substrate may be [11-20] direction and [1-100] direction. The two off-angle directions of GaN substrate 1 may be [1-100] direction and [11-20] direction. In this case, since GaN substrate 1 according to the present invention can be manufactured using the relatively easily available sapphire substrate as base substrate 5, the manufacturing cost of GaN substrate 1 can be reduced.

According to the manufacturing method of the GaN substrate, base substrate 5 may be a ZnO substrate, and the reference plane direction may be [0001]. The two inclined directions of the base substrate may be [1-100] direction and [11-20] direction. The two off-angle directions of GaN substrate 1 may be [1-100] direction and [11-20] direction. In this case, since GaN substrate 1 according to the present invention can be manufactured using the relatively easily available ZnO substrate as base substrate 5, the manufacturing cost of GaN substrate 1 can be reduced.

According to the manufacturing method of the GaN substrate, base substrate 5 may be a SiC substrate, and the reference plane direction may be [0001]. The two inclined directions of the base substrate may be [1-100] direction and [11-20] direction. The two off-angle directions of GaN substrate 1 may be [1-100] direction and [11-20] direction. In this case, since GaN substrate 1 according to the present invention can be manufactured using the relatively easily available SiC substrate as base substrate 5, the manufacturing cost of GaN substrate 1 can be reduced.

According to the manufacturing method of the GaN substrate, base substrate 5 may be a GaN-based substrate, and the reference plane direction may be [0001]. The two inclined directions of the base substrate may be [1-100] direction and [11-20] direction. The two off-angle directions of GaN substrate 1 may be [1-100] direction and [11-20] direction. In this case, since, as base substrate 5 on which the GaN crystal layer to be GaN substrate 1 is formed, the substrate is formed of the same material of GaN, the film quality of GaN crystal layer 3 can be improved, and GaN substrate 1 is favorable in film quality.

According to the manufacturing method of the GaN substrate, one of the two inclined angles of base substrate 5 in the inclined directions of the base substrate may be 10° to 40°, and the other may be 0.02° to 40°. In this case, the two inclined angles of GaN substrate 1 to be formed in the off-angle directions can be adjusted to be 10° to 40° and 0.02° to 40°.

According to the manufacturing method of the GaN substrate, the pattern of mask layer 10 may be a plurality of linear patterns extending in parallel to one another at intervals as shown in FIG. 9. In this case, since the defect such as dislocation of GaN crystal layer 3 is concentrated in the linear portions of mask layer 10 and defect concentrated regions 51 are formed, GaN substrate 1 in which defect concentrated regions 51 on the main surface are formed so as to extend linearly in parallel to one another (in the form of a so-called stripe) can be easily provided. In addition, regarding the extending direction of the linear portions in the pattern of mask layer 10 and the inclined direction of the base substrate, it is preferable to form the pattern such that the extending direction of defect concentrated regions 51 of the GaN substrate that grow on the base substrate is [1-100] direction, and the inclined direction of the plane direction [0001] of the GaN crystal is [11-20] direction. In this case, when cleavage is provided on (1-100) plane at the time of manufacturing an LD, opposed cleavage planes are parallel to each other, which is preferable when a laser resonance plane is manufactured.

According to the manufacturing method of the GaN substrate, the pattern of mask layer 10 may be a plurality of islands-like portions dispersed at intervals, as shown in FIG. 10. In this case, since the defect such as dislocation of GaN crystal layer 3 is concentrated in the islands-like portions dispersed in mask layer 10 and defect concentrated regions 51 are formed, GaN substrate 1 according to the present invention in which defect concentrated regions 51 on the main surface are dispersed in low-defect crystal region 52 can be easily provided.

Example 1

In order to confirm the effect of the present invention, the following experiments were performed. That is, a GaN substrate according to the present invention was manufactured, and a light emitting element was manufactured with the GaN substrate. Then, a relation between the wavelength of the emitted light and the supplied current amount in each of the GaN substrate and the light emitting element was measured as will be described later. In addition, for comparison, a GaN substrate in which the main surface is a c-plane and a GaN substrate in which the main surface is an m-plane were prepared, and light emitting elements were formed with the GaN substrates likewise for comparison. Thus, the characteristics of the light emitting elements as comparison examples were measured similarly. The contents of the experiment will be specifically described below.

(1) Preparation of GaN Substrate (1-1) Preparation of GaN Substrate According to the Present Invention Base substrate:

A 2-inch GaAs substrate was used as a base substrate. That is, in the GaAs substrate, a crystal direction [111] is inclined in <1-10> direction with respect to the normal vector of the surface of the base substrate by 18°, and it is further inclined in <11-2> direction by 0.03°. Thus, a mask layer having a stripe-shaped pattern shown in FIG. 9 was formed on the plane of the base substrate. This mask layer was formed of silicon oxide ($SiO_2$). In mask layer 10, a width W1 of a linear pattern was 50 μm, a width W2 of an opening was 550 μm, and a stripe pitch P of the linear pattern was 600 μm. In addition, a thickness of mask layer 10 was 0.1 μm. In addition, the extending direction of mask layer 10 was <1-10> direction.

Film Formation Condition:

A GaN crystal layer was formed on the surface of the above base substrate under the following conditions. That is, the GaN crystal layer was formed on the plane of the base substrate by the HVPE method using film formation device 20 shown in FIG. 11. In the growing step of the GaN crystal on the plane of the base substrate, a thin buffer layer was grown at a relatively low temperature first. Then, a thick GaN epitaxial layer was grown on the buffer layer at a relatively high temperature. The film formation conditions of the buffer layer were such that the film formation temperature was 500° C., the partial pressure of HCl was $1\times10^{-3}$ atm (100 Pa), the partial pressure of $NH_3$ was 0.1 atm (1000 Pa), the film formation time was 60 minutes, and the thickness of the formed buffer layer was 60 nm. In addition, the film formation conditions of the GaN epitaxial layer were such that the film formation temperature was 1030° C., the partial pressure of HCl was $3\times10^{-2}$ atm (3000 Pa), the partial pressure of $NH_3$ was 0.2 atm (20000 Pa), the film formation time was 100 hours while Si is doped as an n-type dopant, and the thickness of the formed epitaxial layer was 10 mm.

Then, the GaAs substrate was removed from the formed GaN film using a mechanical grinding machine. Thus, the self-standing GaN substrate having a thickness of 10 mm was provided. Then, the GaN substrate was sliced to be 400 µm in thickness with a wire saw, and its planes were polished, whereby ten 2-inch GaN substrates were provided.

(1-2) Preparation of GaN Substrate as Comparison Example
GaN Substrate Having Main Surface of c-plane:
Although a GaN substrate was basically manufactured through the same manufacturing method as that of the GaN substrate according to the present invention as described above, it is different from the above GaN substrate in that the crystal direction [111] of the GaAs substrate as the base substrate is parallel to the normal vector of its main surface. In the self-standing GaN substrate manufactured with such a base substrate, the normal vector of the main surface is parallel to the crystal direction [0001], and the main surface is parallel to the (0001) plane (c-plane).

GaN Substrate Having Main Surface of m-plane:
A GaN substrate having the main surface of m-plane was prepared by cutting the GaN substrate having the main surface of c-plane in a vertical direction to its main surface to provide a 400 µm substrate.

(2) Formation of Light Emitting Element

An epitaxial layer was deposited and an electrode was formed on the plane of the GaN substrates according to the Example of the present invention and according to the comparison examples, and divided by each element, whereby a light emitting element as shown in FIG. 13 was provided. The thickness of n-type AlGaN middle layer 31 of the light emitting element was 50 nm, the thickness of n-type GaN buffer layer 32 was 2 µm, the thickness of light emitting layer 33 was 50 nm, the thickness of p-type AlGaN layer 34 was 20 nm, and the thickness of p-type GaN contact layer 35 was 50 nm. In addition, as n-electrode 36, Al/Ti was used, and its thickness was such that Al: 500 nm and Ti: 50 nm. In addition, as p-electrode 37, Pt/Ti was used as materials, and its thickness was such that Pt: 500 nm and Ti: 50 nm. As another n-electrode, Au/Ge/Ni (respective thicknesses were 500 nm/100 nm/50 nm), Pt/Ti (respective thicknesses were 500 nm/50 nm), and Au/Ti (respective thicknesses were 500 nm/50 nm) may be used, and as another p-electrode, Pt (thickness 500 nm) and Ni (thickness 500 nm) may be used. Since such a light emitting element contains InGaN as light emitting layer 33, it emits light in a green region whose wavelength is longer than that of a blue region.

(3) Measurement Contents

The off-angle (inclined direction and inclined angle of the plane direction [0001] with respect to the normal vector of the main surface of the GaN substrate) of the GaN substrate provided as described above was measured. In addition, the in-plane distribution of the values of the off-angles was also measured. In addition, the dislocation density of the GaN substrate was also measured. Furthermore, a relation between an emission wavelength and a current amount of the formed light emitting element was measured.

(3-1) Measurement Method
Measurement of Off-Angle of GaN Substrate and Distribution of Off-Angle Values:
The off-angle of the GaN substrate was measured by a two-crystal XRD (X-ray diffraction) system with slit sizes of 200 µm vertically and horizontally. As for the distribution of the off-angle values of the GaN substrate, the off-angles at five points, i.e., a center point and four points apart from the center point in the <1-100> direction and <11-20> direction by 20 µm each in the main surface of GaN substrate were measured with the above XRD system. The maximum value of the absolute values of differences between the values at the four points apart from the center point by 20 nm and the value of the center point was set as the value of distribution of the off-angles. In addition, the measurement precision of the XRD is ±0.01°.

Measurement of Dislocation Density of GaN Substrate:
Measurement was performed of the same five points in the GaN substrate by the above XRD by counting dark points in □100 µm using a CL (cathode luminescence) with an SEM.

Measurement of Wavelength of Emitted Light of Light Emitting Element and Supplied Current Amount:
The wavelength of the light emitted from the formed light emitting element was measured while the value of the supplied current was changed. More specifically, the emission spectrum was measured at room temperature by applying a pulse current to the light emitting element.

(4) Measurement Result
Off-Angle of GaN Substrate:
According to the off-angle of the GaN substrate, the plane direction [0001] was inclined in [11-20] direction with respect to the normal vector of the surface by about 18°. In addition, the off-angle was inclined in [1-100] direction by about 0.05°. In addition, according to the in-plane distribution of the off-angles in [11-20] direction, the distribution of the off-angles in the plane of the substrate was within a range of ±0.5° (−17.5 to 18.5°). In addition, according to the in-plane distribution of the off-angles in [1-100] direction, the distribution of the off-angles in the plane of the substrate was within a range of ±0.3°.

In addition, the width of the defect concentrated region in the main surface of the GaN substrate was 45 µm, and the width of the low-defect crystal region was 455 µm. In addition, the extending direction of the defect concentrated region was [1-100] direction. In addition, the extending direction and the width of the defect concentrated region and the like were measured by a fluorescence microscope and an XRD system.

Dislocation Density of GaN Substrate:
According to the measurement of the dislocation density of the GaN substrate, the dislocation density was $1\times10^7$ (/cm$^2$) or less in all the samples.

Relation Between Wavelength of Light Emitted from Light Emitting Element and Supplied Current Amount:
According to the relation between the wavelength of the light emitting element and the current amount in the Example of the present invention, although the wavelength of the emitted light was shifted toward a short wavelength as the current amount supplied to the light emitting element is increased, the shift amount was about 7 nm. This value is small as compared with the shift amount of the wavelength of 20 nm in the light emitting element according to the comparison example manufactured with the conventional GaN substrate, that is, the c-plane substrate in which the substrate plane and the c-plane of GaN are approximately parallel to each other. In the case of the light emitting element according to the comparison example that was manufactured with the m-plane substrate, there was no shift in the wavelength. This is considered because the m-plane is a nonpolar plane, an internal electric field is not generated in the light emitting layer.

Example 2

In order to confirm the effect of the present invention, the following experiments were performed. That is, GaN substrates were manufactured as samples ID1 to 66 according to an Example and samples ID11 to 5 according to a comparison example as will be described later, and the off-angle directions, the off-angles, the in-plane distribution of the off-angles, and the dislocation density of the samples of the GaN substrates were measured. Furthermore, a light emitting element was formed with each of the GaN substrates, and the change amount of the emission wavelength (blue shift: Δλ), the increase amount of the operation voltage (ΔVop) after 1000 hours and emission wavelength distribution (σ) in the plane of the GaN substrate were measured while the current value applied to the light emitting element was changed. The contents of the experiment will be described in more detail.

(1) Preparation of GaN Substrate

For all the samples (samples ID1 to 66 in the Example and samples ID 1 to 5 in the comparison example), GaN substrates were provided through basically the same manufacturing method as that of the GaN substrate according to the above Example 1.

Base Substrate:

While a GaAs substrate was used as the base substrate for forming the GaN substrate for samples ID1 to 60 of the Example and samples ID1 to 5 of the comparison example, a substrate formed of a material different from GaAs was used as the base substrate for samples ID61 to 66 of the Example. More specifically, a sapphire substrate is used as the base substrate for samples ID61, 62, and 66 of the Example, and a ZnO substrate, a SiC substrate, and a GaN substrate were used for samples ID63 to 65 of the Example, respectively. With respect to each base substrate, the inclined angle (off-angle) of the plane direction [0001] inclined in one or two directions with respect to the normal direction of the main surface for forming the GaN crystal film was set appropriately so that the GaN substrate to be formed was inclined in one or two off-angle directions.

More specifically, the plane direction [0001] of the GaAs substrate is inclined in <1-10> direction and <11-2> direction with respect to the normal vector of the main surface of the GaAs substrate so that the plane direction [0001] of GaN is inclined in [11-20] direction and [1-100] direction with respect to the surface of the GaN crystal film to be formed. The inclined angles in the directions (off-angle directions) (off-angle θ1 of <1-10> direction and off-angle θ2 of <11-2> direction) were changed with respect to each sample.

In addition, the plane direction [0001] of the sapphire substrate is inclined in [11-20] direction and [1-100] direction with respect to the normal vector of the main surface of the sapphire substrate so that the plane direction [0001] of GaN is inclined in [1-100] direction and [11-20] direction with respect to the surface of the GaN crystal film to be formed. The inclined angles in the directions (off-angle directions) (off-angle θ1 of [11-20] direction and off-angle θ2 of [1-100] direction) were set such that θ1=θ2=26° for sample ID61, and θ1=θ2=40° for sample ID62.

In addition, the plane direction [0001] of the ZnO substrate is inclined in [1-100] direction and [11-20] direction with respect to the normal vector of the main surface of the ZnO substrate. The inclined angles in the directions (off-angle directions) (off-angle θ1 of [1-100] direction and off-angle θ2 of [11-20] direction) were set such that θ1=θ2=26°.

In addition, the plane direction [0001] of the SiC substrate is inclined in [1-100] direction and [11-20] direction with respect to the normal vector of the main surface of the SiC substrate. The inclined angles in the directions (off-angle directions) (off-angle θ1 of [1-100] direction and off-angle θ2 of [11-20] direction) were set such that θ1=26°.

In addition, the plane direction [0001] of the GaN substrate is inclined in [1-100] direction and [11-20] direction with respect to the normal vector of the main surface of the GaN substrate, the GaN substrate being the base substrate of sample ID65 of the Example. The inclined angles in the directions (off-angle directions) (off-angle θ1 of [1-100] direction and off-angle θ2 of [11-20] direction) were set such that θ1=θ2=26°. In addition, the GaN substrate of sample ID57 was used as this GaN substrate.

In addition, similar to the case of Example 1, the mask layers having the stripe pattern shown in FIG. 9 were formed on the main surfaces of the base substrates of samples ID1 to 65 of the Example and samples ID1 to 5 of the comparison example. The thickness of the mask layer and size of the linear pattern are the same as those of Example 1. In addition, the mask layer having the dot pattern shown in FIG. 10 was formed on the main surface of the base substrate of sample ID66 of the Example. In the mask layer, the plan shape of the island-shaped mask layer (dot-shaped mask layer) was a circle and its diameter was 50 μm, and the distance between the dots of the mask layer (distance between the centers of the dots of the mask layer) was 600 μm.

Film Formation Condition:

A GaN crystal layer was formed on the plane of the above base substrate under the conditions shown in tables 1 to 16 as will be described later. That is, the GaN crystal layer was formed on the plane of the base substrate by the HVPE method with film formation device 20 shown in FIG. 11. In step of growing GaN crystal on the plane of the base substrate, a thin buffer layer was grown at a relatively low temperature first. Then, a thick GaN epitaxial layer was grown on the buffer layer at a relatively high temperature. The film formation conditions of the buffer layer were as shown in the tables 1 to 16 as will be described later. In addition, regarding sample ID65 having the substrate formed of GaN as the base substrate, the buffer layer was not grown, and a GaN epitaxial layer was directly grown on the base substrate.

Then, the base substrate such as the GaAs substrate was removed from the formed GaN film by grinding. Thus, a self-standing GaN substrate having a thickness of 10 mm was provided. Then, the GaN substrate was sliced to 400 μm in thickness with a wire saw and the planes were polished, whereby ten 2-inch GaN substrates were provided.

(2) Formation of Light Emitting Element

An epitaxial layer was deposited on each plane of the GaN substrate of samples ID1 to 66 of the Example and samples ID1 to 5 of the comparison example, and an electrode was further formed and divided by each element, whereby the light emitting element as shown in FIG. 13 was formed. In addition, the composition and the thickness of each layer of the light emitting element were the same as those of the light emitting element in Example 1.

(3) Measurement

The off-angles (inclined angle (off-angle θa) in [1-100] direction and inclined angle (off-angle θb) in [11-20] direction of the plane direction [0001] with respect to the normal vector of the surface of the GaN substrate) of the GaN substrate provided as described above were measured. In addition, the in-plane distribution of the off-angle values was also measured. In addition, the dislocation density of the GaN substrate was also measured. Furthermore, a relation between an emission wavelength and a current amount was measured for the formed light emitting element. The measurement method of each data was as follows.

Measurement of off-angle of GaN substrate and distribution of off-angle values:

The off-angle of GaN substrate was measured by the XRD (X-ray diffraction) system in a similar manner to the measurement method of the off-angle in Example 1. The distribution of the off-angles in the surface of the GaN substrate was measured by the same measurement method as that in Example 1.

Measurement of Dislocation Density of GaN Substrate:

The dislocation density of the GaN substrate was measured using a CL attached to an SEM by the same measurement method as that in Example 1.

Measurement of Change Amount of the Emission Wavelength (Blue Shift: $\Delta\lambda$) of Light Emitting Element:

The wavelength of the light emitted from the light emitting element was measured while the value of the supplied current was changed. The specific measurement method was the same as that in Example 1. A difference between the emission wavelength when the current value supplied to the light emitting element was sufficiently great (specifically 200 mA) and the emission wavelength when the current was 10 mA was measured as the blue shift ($\Delta\lambda$ (unit: nm)).

Measurement of Increase Amount ($\Delta$Vop) of Operation Voltage of Light Emitting Element After 1000 Hours:

The voltages required to flow a current of 100 mA through the light emitting element at a temperature of 80° C. were found by measuring an operation voltage at the start of the operation and an operation voltage after operated for 1000 hours and comparing them, and the increased amount was regarded as $\Delta$Vop (unit: V)

Measurement of Emission Wavelength distribution ($\sigma$) in the Plane of GaN Substrate:

In order to form a light emitting element, the wavelength distribution in the plane of the GaN substrate having an epitaxial layer on its plane was measured. According to a specific measurement method, an n-electrode was formed on the back surface of the GaN substrate and a p-electrode was formed on the epitaxial layer, and then ten light emitting elements were retrieved from □500 μm (rectangle having a plan shape of 500 μm×500 μm) at each point of five points, i.e., a center point of the substrate and four points apart from the center point in the <1-100> direction and <11-20> direction by 20 mm each. A pulse current was applied to each of the fifty light emitting elements thus provided, at room temperature to measure an emission spectrum and calculate an average value of the emission wavelength with respect to each point. Thus, the maximum value among the absolute values of differences between the average values of the emission wavelengths of the center point and the other four points (five pieces of data) was set to the wavelength distribution (unit: nm).

(4) Measurement Result

Measurement results are shown below.

TABLE 1

| SECTION | | | COMPARISON EXAMPLE 1 | EXAMPLE 1 | EXAMPLE 2 | EXAMPLE 3 | EXAMPLE 4 | EXAMPLE 5 |
|---|---|---|---|---|---|---|---|---|
| SAMPLE ID | | | | | | | | |
| BASE SUBSTRATE | | MATERIAL | | | GaAs | | | |
| | | SIZE (INCH) | | | 2 | | | |
| | | OFF DIRECTION <1-10> → CORRESPONDING OFF DIRECTION [11-20] IN GaN OFF-ANGLE θ1 | 0 | 2.5 | 5 | 10 | 18 | 25 |
| | | OFF DIRECTION <11-2> → CORRESPONDING OFF DIRECTION [1-100] IN GaN OFF-ANGLE θ2 | 0 | 0 | 0 | 0 | 0 | 0 |
| | | MASK CONFIGURATION | STRIPE | STRIPE | STRIPE | STRIPE | STRIPE | STRIPE |
| | | INTERVAL (μm) | 500 | 500 | 500 | 500 | 500 | 500 |
| GROWTH CONDITION | BUFFER LAYER | TEMPERATURE ° C. | 500 | 500 | 500 | 500 | 500 | 500 |
| | | HCl atm | $1 \times 10^{-3}$ | $1 \times 10^{-3}$ | $1 \times 10^{-3}$ | $1 \times 10^{-3}$ | $1 \times 10^{-3}$ | $1 \times 10^{-3}$ |
| | | $NH_3$ atm | 0.1 | 0.1 | 0.1 | 0.1 | 0.1 | 0.1 |
| | | TIME min | 60 | 60 | 60 | 60 | 60 | 60 |
| | | THICKNESS nm | 60 | 60 | 60 | 60 | 60 | 60 |
| | EPITAXIAL LAYER | TEMPERATURE ° C. | 1030 | 1030 | 1030 | 1030 | 1030 | 1030 |
| | | HCl atm | $3 \times 10^{-2}$ | $3 \times 10^{-2}$ | $3 \times 10^{-2}$ | $3 \times 10^{-2}$ | $3 \times 10^{-2}$ | $3 \times 10^{-2}$ |
| | | $NH_3$ atm | 0.2 | 0.2 | 0.2 | 0.2 | 0.2 | 0.2 |
| | | TIME min | 100 | 100 | 100 | 100 | 100 | 100 |
| | | THICKNESS nm | 10 | 10 | 10 | 10 | 10 | 10 |
| | | DOPANT | 0 (OXYGEN) | 0 (OXYGEN) | 0 (OXYGEN) | 0 (OXYGEN) | 0 (OXYGEN) | 0 (OXYGEN) |
| PRODUCT (GaN CRYSTAL) | | SIZE | | | 2 | | | |
| | | OFF DIRECTION [1-100] OFF-ANGLE θa | 0.01 | 2.55 | 5.05 | 10.05 | 18.40 | 25.01 |
| | | OFF DIRECTION [11-20] OFF-ANGLE θb | 0.01 | 0.02 | 0.01 | 0.00 | 0.01 | 0.00 |
| | | OFF-ANGLE IN-PLANE DISTRIBUTION Δθa | ±2 | ±1.8 | ±2.0 | ±2.0 | ±2.0 | ±2.4 |
| | | OFF-ANGLE IN-PLANE DISTRIBUTION Δθb | ±2.1 | ±1.9 | ±2.0 | ±2.2 | ±2.0 | ±2.3 |

TABLE 1-continued

|  |  |  |  |  |  |  |
|---|---|---|---|---|---|---|
| DISLOCATION DENSITY | 6.0E+05 | 6.0E+05 | 6.0E+05 | 6.0E+05 | 6.0E+05 | 6.0E+05 |
| Blue Shift ($\Delta\lambda$) | 22 | 15 | 10 | 10 | 8 | 8 |
| $\Delta$Vop (V) | 0.06 | 0.04 | 0.04 | 0.05 | 0.04 | 0.06 |
| 2-INCH IN-PLANE WAVELENGTH DISTRIBUTION $\sigma$ | ±9 | ±4.9 | ±4.8 | ±5.0 | ±6.0 | ±4.8 |

| SECTION | | | EXAMPLE 6 | EXAMPLE 7 | EXAMPLE 8 | COMPARISON EXAMPLE 2 |
|---|---|---|---|---|---|---|
| SAMPLE ID | | | | | | |
| BASE SUBSTRATE | | MATERIAL | | | GaAs | |
| | | SIZE (INCH) | | | 2 | |
| | | OFF DIRECTION <1-10> → CORRESPONDING OFF DIRECTION [11-20] IN GaN | | | | |
| | | OFF-ANGLE $\theta_1$ | 26 | 34 | 40 | 45 |
| | | OFF DIRECTION <11-2> → CORRESPONDING OFF DIRECTION [1-100] IN GaN | | | | |
| | | OFF-ANGLE $\theta_2$ | 0 | 0 | 0 | 0 |
| | | MASK CONFIGURATION | STRIPE | STRIPE | STRIPE | STRIPE |
| | | INTERVAL (μm) | 500 | 500 | 500 | 500 |
| GROWTH CONDITION | BUFFER LAYER | TEMPERATURE ° C. | 500 | 500 | 500 | 500 |
| | | HCl atm | $1 \times 10^{-3}$ | $1 \times 10^{-3}$ | $1 \times 10^{-3}$ | $1 \times 10^{-3}$ |
| | | $NH_3$ atm | 0.1 | 0.1 | 0.1 | 0.1 |
| | | TIME min | 60 | 60 | 60 | 60 |
| | | THICKNESS nm | 60 | 60 | 60 | 60 |
| | EPITAXIAL LAYER | TEMPERATURE ° C. | 1030 | 1030 | 1030 | 1030 |
| | | HCl atm | $3 \times 10^{-2}$ | $3 \times 10^{-2}$ | $3 \times 10^{-2}$ | $3 \times 10^{-2}$ |
| | | $NH_3$ atm | 0.2 | 0.2 | 0.2 | 0.2 |
| | | TIME min | 100 | 100 | 100 | 100 |
| | | THICKNESS nm | 10 | 10 | 10 | 10 |
| | | DOPANT | 0 (OXYGEN) | 0 (OXYGEN) | 0 (OXYGEN) | 0 (OXYGEN) |
| PRODUCT (GaN CRYSTAL) | | SIZE | | | 2 | |
| | | OFF DIRECTION [1-100] OFF-ANGLE $\theta_a$ | 26.12 | 34.19 | 39.90 | POLYCRYSTALLIZED |
| | | OFF DIRECTION [11-20] OFF-ANGLE $\theta_b$ | 0.02 | 0.02 | 0.00 | POLYCRYSTALLIZED |
| | | OFF-ANGLE IN-PLANE DISTRIBUTION $\Delta\theta_a$ | ±1.7 | ±2.0 | ±2.2 | POLYCRYSTALLIZED |
| | | OFF-ANGLE IN-PLANE DISTRIBUTION $\Delta\theta_b$ | ±1.6 | ±2.0 | ±2.3 | POLYCRYSTALLIZED |
| | | DISLOCATION DENSITY | 6.0E+05 | 6.0E+05 | 6.0E+05 | POLYCRYSTALLIZED |
| | | Blue Shift ($\Delta\lambda$) | 5 | 5 | 5 | — |
| | | $\Delta$Vop (V) | 0.04 | 0.05 | 0.06 | — |
| | | 2-INCH IN-PLANE WAVELENGTH DISTRIBUTION $\sigma$ | ±4.8 | ±5.3 | ±6.5 | — |

TABLE 2

| SECTION | | | EXAMPLE 9 | EXAMPLE 10 | EXAMPLE 11 | EXAMPLE 12 | EXAMPLE 13 |
|---|---|---|---|---|---|---|---|
| SAMPLE ID | | | | | | | |
| BASE SUBSTRATE | | MATERIAL | | | GaAs | | |
| | | SIZE (INCH) | | | 2 | | |
| | | OFF DIRECTION <1-10> → CORRESPONDING OFF DIRECTION [11-20] IN GaN | | | | | |
| | | OFF-ANGLE $\theta_1$ | 0 | 0 | 0 | 0 | 0 |
| | | OFF DIRECTION <11-2> → CORRESPONDING OFF DIRECTION [1-100] IN GaN | | | | | |
| | | OFF-ANGLE $\theta_2$ | 2.5 | 5 | 10 | 18 | 25 |
| | | MASK CONFIGURATION | STRIPE | STRIPE | STRIPE | STRIPE | STRIPE |
| | | INTERVAL (μm) | 500 | 500 | 500 | 500 | 500 |

TABLE 2-continued

| | | | | | | | |
|---|---|---|---|---|---|---|---|
| GROWTH CONDITION | BUFFER LAYER | TEMPERATURE ° C. | 500 | 500 | 500 | 500 | 500 |
| | | HCl atm | $1 \times 10^{-3}$ | $1 \times 10^{-3}$ | $1 \times 10^{-3}$ | $1 \times 10^{-3}$ | $1 \times 10^{-3}$ |
| | | $NH_3$ atm | 0.1 | 0.1 | 0.1 | 0.1 | 0.1 |
| | | TIME min | 60 | 60 | 60 | 60 | 60 |
| | | THICKNESS nm | 60 | 60 | 60 | 60 | 60 |
| | EPITAXIAL LAYER | TEMPERATURE ° C. | 1030 | 1030 | 1030 | 1030 | 1030 |
| | | HCl atm | $3 \times 10^{-2}$ | $3 \times 10^{-2}$ | $3 \times 10^{-2}$ | $3 \times 10^{-2}$ | $3 \times 10^{-2}$ |
| | | $NH_3$ atm | 0.2 | 0.2 | 0.2 | 0.2 | 0.2 |
| | | TIME min | 100 | 100 | 100 | 100 | 100 |
| | | THICKNESS nm | 10 | 10 | 10 | 10 | 10 |
| | | DOPANT | 0 (OXYGEN) | 0 (OXYGEN) | 0 (OXYGEN) | 0 (OXYGEN) | 0 (OXYGEN) |
| PRODUCT (GaN CRYSTAL) | | SIZE | | | 2 | | |
| | | OFF DIRECTION [1-100] OFF-ANGLE θa | 0.01 | 0.02 | 0.00 | 0.00 | 0.00 |
| | | OFF DIRECTION [11-20] OFF-ANGLE θb | 2.52 | 5.02 | 10.14 | 18.15 | 25.02 |
| | | OFF-ANGLE IN-PLANE DISTRIBUTION Δθa | ±2 | ±1.5 | ±2.1 | ±1.9 | ±1.7 |
| | | OFF-ANGLE IN-PLANE DISTRIBUTION Δθb | ±2 | ±1.5 | ±2.0 | ±1.8 | ±1.9 |
| | | DISLOCATION DENSITY | 6.0E+05 | 6.0E+05 | 6.0E+05 | 6.0E+05 | 6.0E+05 |
| | | Blue Shift (Δλ) | 15 | 19 | 9 | 7 | 5 |
| | | ΔVop (V) | 0.03 | 0.04 | 0.06 | 0.08 | 0.03 |
| | | 2-INCH IN-PLANE WAVELENGTH DISTRIBUTION σ | ±6 | ±5 | ±5 | ±4 | ±6 |

| | | SECTION SAMPLE ID | EXAMPLE 14 | EXAMPLE 15 | EXAMPLE 16 | COMPARISON EXAMPLE 3 |
|---|---|---|---|---|---|---|
| BASE SUBSTRATE | | MATERIAL | | GaAs | | |
| | | SIZE (INCH) | | 2 | | |
| | | OFF DIRECTION <1-10> → CORRESPONDING OFF DIRECTION [11-20] IN GaN OFF-ANGLE θ1 | 0 | 0 | 0 | 0 |
| | | OFF DIRECTION <11-2> → CORRESPONDING OFF DIRECTION [1-100] IN GaN OFF-ANGLE θ2 | 26 | 34 | 40 | 45 |
| | | MASK CONFIGURATION | STRIPE | STRIPE | STRIPE | STRIPE |
| | | INTERVAL (μm) | 500 | 500 | 500 | 500 |
| GROWTH CONDITION | BUFFER LAYER | TEMPERATURE ° C. | 500 | 500 | 500 | 500 |
| | | HCl atm | $1 \times 10^{-3}$ | $1 \times 10^{-3}$ | $1 \times 10^{-3}$ | $1 \times 10^{-3}$ |
| | | $NH_3$ atm | 0.1 | 0.1 | 0.1 | 0.1 |
| | | TIME min | 60 | 60 | 60 | 60 |
| | | THICKNESS nm | 60 | 60 | 60 | 60 |
| | EPITAXIAL LAYER | TEMPERATURE ° C. | 1030 | 1030 | 1030 | 1030 |
| | | HCl atm | $3 \times 10^{-2}$ | $3 \times 10^{-2}$ | $3 \times 10^{-2}$ | $3 \times 10^{-2}$ |
| | | $NH_3$ atm | 0.2 | 0.2 | 0.2 | 0.2 |
| | | TIME min | 100 | 100 | 100 | 100 |
| | | THICKNESS nm | 10 | 10 | 10 | 10 |
| | | DOPANT | 0 (OXYGEN) | 0 (OXYGEN) | 0 (OXYGEN) | 0 (OXYGEN) |
| PRODUCT (GaN CRYSTAL) | | SIZE | | 2 | | |
| | | OFF DIRECTION [1-100] OFF-ANGLE θa | 0.02 | 0.01 | 0.01 | POLYCRYSTALLIZED |
| | | OFF DIRECTION [11-20] OFF-ANGLE θb | 26.05 | 34.12 | 39.90 | POLYCRYSTALLIZED |
| | | OFF-ANGLE IN-PLANE DISTRIBUTION Δθa | ±1.5 | ±1.9 | ±1.8 | POLYCRYSTALLIZED |
| | | OFF-ANGLE IN-PLANE DISTRIBUTION Δθb | ±1.7 | ±1.9 | ±1.6 | POLYCRYSTALLIZED |
| | | DISLOCATION DENSITY | 6.0E+05 | 6.0E+05 | 6.0E+05 | POLYCRYSTALLIZED |
| | | Blue Shift (Δλ) | 5 | 5 | 4 | — |
| | | ΔVop (V) | 0.04 | 0.05 | 0.06 | — |
| | | 2-INCH IN-PLANE WAVELENGTH DISTRIBUTION σ | ±4 | ±6 | ±7 | — |

In each of samples ID1 to 19, the reference plane direction [111] is inclined in only one direction (<1-10> direction or <11-2> direction) with respect to the normal vector of the main surface of the base substrate. Therefore, the plane direction [0001] is largely inclined in [11-20] direction or [1-100] direction with respect to the normal vector of the main surface of the formed GaN substrate basically.

As can be seen from tables 1 and 2, when the off-angle θ1 or θ2 of the base substrate was 2° to 40°(that is, the off-angle θa or θb of the GaN substrate was 2° to 40°), more preferably, when the off-angle θ1 or θ2 of the base substrate was 5° to 40° (that is, the off-angle θa or θb of the GaN substrate was 5° to 40°), the value of the blue shift was small.

TABLE 3

| SECTION | | | EXAMPLE 17 | EXAMPLE 18 | EXAMPLE 19 | EXAMPLE 20 |
|---|---|---|---|---|---|---|
| | | SAMPLE ID | | | | |
| BASE SUBSTRATE | | MATERIAL | GaAs | | | |
| | | SIZE (INCH) | 2 | | | |
| | | OFF DIRECTION <1-10> → CORRESPONDING OFF DIRECTION [11-20] IN GaN | | | | |
| | | OFF-ANGLE θ1 | 10 | 10 | 10 | 10 |
| | | OFF DIRECTION <11-2> → CORRESPONDING OFF DIRECTION [1-100] IN GaN | | | | |
| | | OFF-ANGLE θ2 | 0.03 | 0.05 | 5 | 10 |
| | | MASK CONFIGURATION | STRIPE | STRIPE | STRIPE | STRIPE |
| | | INTERVAL (μm) | 500 | 500 | 500 | 500 |
| GROWTH CONDITION | BUFFER LAYER | TEMPERATURE ° C. | 500 | 500 | 500 | 500 |
| | | HCl atm | $1 \times 10^{-3}$ | $1 \times 10^{-3}$ | $1 \times 10^{-3}$ | $1 \times 10^{-3}$ |
| | | $NH_3$ atm | 0.1 | 0.1 | 0.1 | 0.1 |
| | | TIME min | 60 | 60 | 60 | 60 |
| | | THICKNESS nm | 60 | 60 | 60 | 60 |
| | EPITAXIAL LAYER | TEMPERATURE ° C. | 1030 | 1030 | 1030 | 1030 |
| | | HCl atm | $3 \times 10^{-2}$ | $3 \times 10^{-2}$ | $3 \times 10^{-2}$ | $3 \times 10^{-2}$ |
| | | $NH_3$ atm | 0.2 | 0.2 | 0.2 | 0.2 |
| | | TIME min | 100 | 100 | 100 | 100 |
| | | THICKNESS nm | 10 | 10 | 10 | 10 |
| | | DOPANT | 0 (OXYGEN) | 0 (OXYGEN) | 0 (OXYGEN) | 0 (OXYGEN) |
| PRODUCT (GaN CRYSTAL) | | SIZE | 2 | | | |
| | | OFF DIRECTION [1-100] OFF-ANGLE θa | 9.80 | 10.22 | 10.15 | 10.10 |
| | | OFF DIRECTION [11-20] OFF-ANGLE θb | 0.02 | 0.05 | 5.01 | 5.01 |
| | | OFF-ANGLE IN-PLANE DISTRIBUTION Δθa | ±0.7 | ±0.6 | ±0.6 | ±0.6 |
| | | OFF-ANGLE IN-PLANE DISTRIBUTION Δθb | ±0.9 | ±0.5 | ±0.5 | ±0.5 |
| | | DISLOCATION DENSITY | 6.0E+05 | 6.0E+05 | 6.0E+05 | 6.0E+05 |
| | | Blue Shift (Δλ) | 8 | 8 | 9 | 9 |
| | | ΔVop (V) | 0.005 | 0.004 | 0.003 | 0.003 |
| | | 2-INCH IN-PLANE WAVELENGTH DISTRIBUTION σ | ±2.5 | ±2.8 | ±3 | ±2.9 |

TABLE 4

| SECTION | | | EXAMPLE 21 | EXAMPLE 22 | EXAMPLE 23 | EXAMPLE 24 |
|---|---|---|---|---|---|---|
| | | SAMPLE ID | | | | |
| BASE SUBSTRATE | | MATERIAL | GaAs | | | |
| | | SIZE (INCH) | 2 | | | |
| | | OFF DIRECTION <1-10> → CORRESPONDING OFF DIRECTION [11-20] IN GaN | | | | |
| | | OFF-ANGLE θ1 | 0.03 | 0.05 | 5 | 10 |
| | | OFF DIRECTION <11-2> → CORRESPONDING OFF DIRECTION [1-100] IN GaN | | | | |
| | | OFF-ANGLE θ2 | 10 | 10 | 10 | 10 |
| | | MASK CONFIGURATION | STRIPE | STRIPE | STRIPE | STRIPE |
| | | INTERVAL (μm) | 500 | 500 | 500 | 500 |
| GROWTH CONDITION | BUFFER LAYER | TEMPERATURE ° C. | 500 | 500 | 500 | 500 |
| | | HCl atm | $1 \times 10^{-3}$ | $1 \times 10^{-3}$ | $1 \times 10^{-3}$ | $1 \times 10^{-3}$ |
| | | $NH_3$ atm | 0.1 | 0.1 | 0.1 | 0.1 |
| | | TIME min | 60 | 60 | 60 | 60 |
| | | THICKNESS nm | 60 | 60 | 60 | 60 |
| | EPITAXIAL LAYER | TEMPERATURE ° C. | 1030 | 1030 | 1030 | 1030 |
| | | HCl atm | $3 \times 10^{-2}$ | $3 \times 10^{-2}$ | $3 \times 10^{-2}$ | $3 \times 10^{-2}$ |
| | | $NH_3$ atm | 0.2 | 0.2 | 0.2 | 0.2 |
| | | TIME min | 100 | 100 | 100 | 100 |
| | | THICKNESS nm | 10 | 10 | 10 | 10 |
| | | DOPANT | 0 (OXYGEN) | 0 (OXYGEN) | 0 (OXYGEN) | 0 (OXYGEN) |
| PRODUCT (GaN CRYSTAL) | | SIZE | 2 | | | |
| | | OFF DIRECTION [1-100] OFF-ANGLE θa | 0.02 | 0.05 | 4.99 | 10.12 |
| | | OFF DIRECTION [11-20] | | | | |

TABLE 4-continued

| SECTION SAMPLE ID | EXAMPLE 21 | EXAMPLE 22 | EXAMPLE 23 | EXAMPLE 24 |
|---|---|---|---|---|
| OFF-ANGLE θb | 9.90 | 10.12 | 10.12 | 10.11 |
| OFF-ANGLE IN-PLANE DISTRIBUTION Δθa | ±0.6 | ±0.6 | ±0.6 | ±0.6 |
| OFF-ANGLE IN-PLANE DISTRIBUTION Δθb | ±0.5 | ±0.5 | ±0.5 | ±0.5 |
| DISLOCATION DENSITY | 6.0E+05 | 6.0E+05 | 6.0E+05 | 6.0E+05 |
| Blue Shift (Δλ) | 8 | 9 | 8 | 8 |
| ΔVop (V) | 0.004 | 0.005 | 0.006 | 0.005 |
| 2-INCH IN-PLANE WAVELENGTH DISTRIBUTION σ | ±2.5 | ±2.1 | ±2.8 | ±2.7 |

Tables 3 and 4 show the measurement results when one of the off-angles θ1 and θ2 of the base substrate was fixed to 10°, and the other was 0.02° to 10°(that is, one of the off-angles θa and θb of the GaN substrate was fixed to about 10°, and the other was 0.02° to 10°). According to the samples of the Examples shown in tables 3 and 4, the off-angle in-plane distributions Δθa and Δθb, the increased amount of the operation voltage (ΔVop) and the in-plane wavelength distribution (σ) of the GaN substrate were smaller than those of the samples of the comparison examples and the Examples shown in tables 1 and 2. Although the cause is not clear, it is considered that when the GaN crystal layer is grown with the base substrate (GaAs substrate) having off-angles in two directions, part of the components is prevented from being released (As is released in the case of the GaAs substrate, for example) from the base substrate to the outside, and as a result, the crystal of the formed GaN crystal layer is prevented from being distorted. As a result, it is considered that the off-angle in-plane distributions Δθa and Δθb and the in-plane wavelength distribution (σ) of the GaN substrate are small.

TABLE 5

| | | SECTION SAMPLE ID | EXAMPLE 25 | EXAMPLE 26 | EXAMPLE 27 | EXAMPLE 28 |
|---|---|---|---|---|---|---|
| BASE SUBSTRATE | | MATERIAL | GaAs | | | |
| | | SIZE (INCH) | 2 | | | |
| | | OFF DIRECTION <1-10> → CORRESPONDING OFF DIRECTION [11-20] IN GaN | | | | |
| | | OFF-ANGLE θ1 | 18 | 18 | 18 | 18 |
| | | OFF DIRECTION <11-2> → CORRESPONDING OFF DIRECTION [1-100] IN GaN | | | | |
| | | OFF-ANGLE θ2 | 0.03 | 0.05 | 5 | 10 |
| | | MASK CONFIGURATION | STRIPE | STRIPE | STRIPE | STRIPE |
| | | INTERVAL (μm) | 500 | 500 | 500 | 500 |
| GROWTH CONDITION | BUFFER LAYER | TEMPERATURE ° C. | 500 | 500 | 500 | 500 |
| | | HCl atm | 1 × 10⁻³ | 1 × 10⁻³ | 1 × 10⁻³ | 1 × 10⁻³ |
| | | NH₃ atm | 0.1 | 0.1 | 0.1 | 0.1 |
| | | TIME min | 60 | 60 | 60 | 60 |
| | | THICKNESS nm | 60 | 60 | 60 | 60 |
| | EPITAXIAL LAYER | TEMPERATURE ° C. | 1030 | 1030 | 1030 | 1030 |
| | | HCl atm | 3 × 10⁻² | 3 × 10⁻² | 3 × 10⁻² | 3 × 10⁻² |
| | | NH₃ atm | 0.2 | 0.2 | 0.2 | 0.2 |
| | | TIME min | 100 | 100 | 100 | 100 |
| | | THICKNESS nm | 10 | 10 | 10 | 10 |
| | | DOPANT | 0 (OXYGEN) | 0 (OXYGEN) | 0 (OXYGEN) | 0 (OXYGEN) |
| PRODUCT (GaN CRYSTAL) | | SIZE | 2 | | | |
| | | OFF DIRECTION [1-100] | | | | |
| | | OFF-ANGLE θa | 18.15 | 17.88 | 18.15 | 17.88 |
| | | OFF DIRECTION [11-20] | | | | |
| | | OFF-ANGLE θb | 0.02 | 0.05 | 5.00 | 9.92 |
| | | OFF-ANGLE IN-PLANE DISTRIBUTION Δθa | ±0.7 | ±0.6 | ±0.6 | ±0.6 |
| | | OFF-ANGLE IN-PLANE DISTRIBUTION Δθb | ±0.9 | ±0.5 | ±0.5 | ±0.5 |
| | | DISLOCATION DENSITY | 6.0E+05 | 6.0E+05 | 6.0E+05 | 6.0E+05 |
| | | Blue Shift (Δλ) | 6 | 7 | 6 | 6 |
| | | ΔVop (V) | 0.002 | 0.003 | 0.004 | 0.004 |
| | | 2-INCH IN-PLANE WAVELENGTH DISTRIBUTION σ | ±2.5 | ±2.1 | ±2.8 | ±2.6 |

TABLE 6

| | SECTION SAMPLE ID | EXAMPLE 29 | EXAMPLE 30 | EXAMPLE 31 | EXAMPLE 32 |
|---|---|---|---|---|---|
| BASE SUBSTRATE | MATERIAL | GaAs | | | |
| | SIZE (INCH) | 2 | | | |
| | OFF DIRECTION <1-10> → CORRESPONDING OFF DIRECTION [11-20] IN GaN | | | | |

TABLE 6-continued

| | | SECTION<br>SAMPLE ID | EXAMPLE 29 | EXAMPLE 30 | EXAMPLE 31 | EXAMPLE 32 |
|---|---|---|---|---|---|---|
| | | OFF-ANGLE θ1<br>OFF DIRECTION <11-2> → CORRESPONDING<br>OFF DIRECTION [1-100] IN GaN | 0.03 | 0.05 | 5 | 10 |
| | | OFF-ANGLE θ2 | 18 | 18 | 18 | 18 |
| | | MASK CONFIGURATION | STRIPE | STRIPE | STRIPE | STRIPE |
| | | INTERVAL (μm) | 500 | 500 | 500 | 500 |
| GROWTH<br>CONDITION | BUFFER<br>LAYER | TEMPERATURE ° C. | 500 | 500 | 500 | 500 |
| | | HCl atm | $1 \times 10^{-3}$ | $1 \times 10^{-3}$ | $1 \times 10^{-3}$ | $1 \times 10^{-3}$ |
| | | $NH_3$ atm | 0.1 | 0.1 | 0.1 | 0.1 |
| | | TIME min | 60 | 60 | 60 | 60 |
| | | THICKNESS nm | 60 | 60 | 60 | 60 |
| | EPITAXIAL<br>LAYER | TEMPERATURE ° C. | 1030 | 1030 | 1030 | 1030 |
| | | HCl atm | $3 \times 10^{-2}$ | $3 \times 10^{-2}$ | $3 \times 10^{-2}$ | $3 \times 10^{-2}$ |
| | | $NH_3$ atm | 0.2 | 0.2 | 0.2 | 0.2 |
| | | TIME min | 100 | 100 | 100 | 100 |
| | | THICKNESS nm | 10 | 10 | 10 | 10 |
| | | DOPANT | 0 (OXYGEN) | 0 (OXYGEN) | 0 (OXYGEN) | 0 (OXYGEN) |
| PRODUCT (GaN<br>CRYSTAL) | | SIZE | | | 2 | |
| | | OFF DIRECTION [1-100]<br>OFF-ANGLE θa | 0.02 | 0.05 | 5.01 | 10.17 |
| | | OFF DIRECTION [11-20]<br>OFF-ANGLE θb | 18.16 | 17.88 | 18.08 | 18.08 |
| | | OFF-ANGLE IN-PLANE DISTRIBUTION Δθa | ±0.7 | ±0.6 | ±0.6 | ±0.6 |
| | | OFF-ANGLE IN-PLANE DISTRIBUTION Δθb | ±0.9 | ±0.5 | ±0.5 | ±0.5 |
| | | DISLOCATION DENSITY | 6.0E+05 | 6.0E+05 | 6.0E+05 | 6.0E+05 |
| | | Blue Shift (Δλ) | 6 | 6 | 7 | 7 |
| | | ΔVop (V) | 0.005 | 0.005 | 0.004 | 0.004 |
| | | 2-INCH IN-PLANE WAVELENGTH DISTRIBUTION σ | ±2.5 | ±2.1 | ±2.5 | ±2.6 |

Tables 5 and 6 show the measurement results when one of the off-angles θ1 and θ2 of the base substrate was fixed to 18°, and the other was 0.02° to 10°(that is, one of the off-angles θa and θb of the GaN substrate was fixed to about 18°, and the other was 0.02° to 10°).

TABLE 7

| | | SECTION<br>SAMPLE ID | EXAMPLE 33 | EXAMPLE 34 | EXAMPLE 35 | EXAMPLE 36 |
|---|---|---|---|---|---|---|
| BASE SUBSTRATE | | MATERIAL | GaAs | | | |
| | | SIZE (INCH) | 2 | | | |
| | | OFF DIRECTION <1-10> → CORRESPONDING<br>OFF DIRECTION [11-20] IN GaN<br>OFF-ANGLE θ1 | 25 | 25 | 25 | 25 |
| | | OFF DIRECTION <11-2> → CORRESPONDING<br>OFF DIRECTION [1-100] IN GaN<br>OFF-ANGLE θ2 | 0.03 | 0.05 | 5 | 10 |
| | | MASK CONFIGURATION | STRIPE | STRIPE | STRIPE | STRIPE |
| | | INTERVAL (μm) | 500 | 500 | 500 | 500 |
| GROWTH<br>CONDITION | BUFFER<br>LAYER | TEMPERATURE ° C. | 500 | 500 | 500 | 500 |
| | | HCl atm | $1 \times 10^{-3}$ | $1 \times 10^{-3}$ | $1 \times 10^{-3}$ | $1 \times 10^{-3}$ |
| | | $NH_3$ atm | 0.1 | 0.1 | 0.1 | 0.1 |
| | | TIME min | 60 | 60 | 60 | 60 |
| | | THICKNESS nm | 60 | 60 | 60 | 60 |
| | EPITAXIAL<br>LAYER | TEMPERATURE ° C. | 1030 | 1030 | 1030 | 1030 |
| | | HCl atm | $3 \times 10^{-2}$ | $3 \times 10^{-2}$ | $3 \times 10^{-2}$ | $3 \times 10^{-2}$ |
| | | $NH_3$ atm | 0.2 | 0.2 | 0.2 | 0.2 |
| | | TIME min | 100 | 100 | 100 | 100 |
| | | THICKNESS nm | 10 | 10 | 10 | 10 |
| | | DOPANT | 0 (OXYGEN) | 0 (OXYGEN) | 0 (OXYGEN) | 0 (OXYGEN) |
| PRODUCT (GaN<br>CRYSTAL) | | SIZE | | | 2 | |
| | | OFF DIRECTION [1-100]<br>OFF-ANGLE θa | 24.97 | 24.85 | 24.88 | 24.95 |
| | | OFF DIRECTION [11-20]<br>OFF-ANGLE θb | 0.02 | 0.05 | 4.97 | 9.97 |
| | | OFF-ANGLE IN-PLANE DISTRIBUTION Δθa | ±0.7 | ±0.6 | ±0.6 | ±0.6 |
| | | OFF-ANGLE IN-PLANE DISTRIBUTION Δθb | ±0.9 | ±0.5 | ±0.5 | ±0.5 |

TABLE 7-continued

| SECTION SAMPLE ID | EXAMPLE 33 | EXAMPLE 34 | EXAMPLE 35 | EXAMPLE 36 |
|---|---|---|---|---|
| DISLOCATION DENSITY | 6.0E+05 | 6.0E+05 | 6.0E+05 | 6.0E+05 |
| Blue Shift($\Delta\lambda$) | 4 | 4 | 4 | 4 |
| $\Delta$Vop (V) | 0.003 | 0.004 | 0.005 | 0.005 |
| 2-INCH IN-PLANE WAVELENGTH DISTRIBUTION $\sigma$ | ±2.4 | ±2.1 | ±2.5 | ±2.3 |

TABLE 8

| | | SECTION SAMPLE ID | EXAMPLE 37 | EXAMPLE 38 | EXAMPLE 39 | EXAMPLE 40 |
|---|---|---|---|---|---|---|
| BASE SUBSTRATE | | MATERIAL | GaAs | | | |
| | | SIZE (INCH) | 2 | | | |
| | | OFF DIRECTION <1-10> → CORRESPONDING OFF DIRECTION [11-20] IN GaN OFF-ANGLE θ1 | 0.03 | 0.05 | 5 | 10 |
| | | OFF DIRECTION <11-2> → CORRESPONDING OFF DIRECTION [1-100] IN GaN OFF-ANGLE θ2 | 25 | 25 | 25 | 25 |
| | | MASK CONFIGURATION | STRIPE | STRIPE | STRIPE | STRIPE |
| | | INTERVAL (μm) | 500 | 500 | 500 | 500 |
| GROWTH CONDITION | BUFFER LAYER | TEMPERATURE ° C. | 500 | 500 | 500 | 500 |
| | | HCl atm | $1 \times 10^{-3}$ | $1 \times 10^{-3}$ | $1 \times 10^{-3}$ | $1 \times 10^{-3}$ |
| | | NH$_3$ atm | 0.1 | 0.1 | 0.1 | 0.1 |
| | | TIME min | 60 | 60 | 60 | 60 |
| | | THICKNESS nm | 60 | 60 | 60 | 60 |
| | EPITAXIAL LAYER | TEMPERATURE ° C. | 1030 | 1030 | 1030 | 1030 |
| | | HCl atm | $3 \times 10^{-2}$ | $3 \times 10^{-2}$ | $3 \times 10^{-2}$ | $3 \times 10^{-2}$ |
| | | NH$_3$ atm | 0.2 | 0.2 | 0.2 | 0.2 |
| | | TIME min | 100 | 100 | 100 | 100 |
| | | THICKNESS nm | 10 | 10 | 10 | 10 |
| | | DOPANT | 0 (OXYGEN) | 0 (OXYGEN) | 0 (OXYGEN) | 0 (OXYGEN) |
| PRODUCT (GaN CRYSTAL) | | SIZE | 2 | | | |
| | | OFF DIRECTION [1-100] OFF-ANGLE θa | 0.02 | 0.05 | 4.98 | 9.98 |
| | | OFF DIRECTION [11-20] OFF-ANGLE θb | 24.87 | 24.85 | 24.84 | 24.81 |
| | | OFF-ANGLE IN-PLANE DISTRIBUTION $\Delta$θa | ±0.7 | ±0.6 | ±0.6 | ±0.6 |
| | | OFF-ANGLE IN-PLANE DISTRIBUTION $\Delta$θb | ±0.9 | ±0.5 | ±0.5 | ±0.5 |
| | | DISLOCATION DENSITY | 6.0E+05 | 6.0E+05 | 6.0E+05 | 6.0E+05 |
| | | Blue Shift ($\Delta\lambda$) | 5 | 5 | 4 | 4 |
| | | $\Delta$Vop (V) | 0.003 | 0.002 | 0.005 | 0.005 |
| | | 2-INCH IN-PLANE WAVELENGTH DISTRIBUTION $\sigma$ | ±2.4 | ±2.2 | ±2.5 | ±2.6 |

Tables 7 and 8 show the measurement results when one of the off-angles θ1 and θ2 of the base substrate was fixed to 25°, and the other was 0.02° to 10°(that is, one of the off-angles θa and θb of the GaN substrate was fixed to about 25°, and the other was 0.02° to 10°).

TABLE 9

| | | SECTION SAMPLE ID | EXAMPLE 41 | EXAMPLE 42 | EXAMPLE 43 | EXAMPLE 44 |
|---|---|---|---|---|---|---|
| BASE SUBSTRATE | | MATERIAL | GaAs | | | |
| | | SIZE (INCH) | 2 | | | |
| | | OFF DIRECTION <1-10> → CORRESPONDING OFF DIRECTION [11-20] IN GaN OFF-ANGLE θ1 | 28 | 28 | 28 | 28 |
| | | OFF DIRECTION <11-2> → CORRESPONDING OFF DIRECTION [1-100] IN GaN OFF-ANGLE θ2 | 0.03 | 0.05 | 5 | 10 |
| | | MASK CONFIGURATION | STRIPE | STRIPE | STRIPE | STRIPE |
| | | INTERVAL (μm) | 500 | 500 | 500 | 500 |

TABLE 9-continued

| SECTION | | | EXAMPLE 41 | EXAMPLE 42 | EXAMPLE 43 | EXAMPLE 44 |
|---|---|---|---|---|---|---|
| | | SAMPLE ID | | | | |
| GROWTH CONDITION | BUFFER LAYER | TEMPERATURE °C. | 500 | 500 | 500 | 500 |
| | | HCl atm | $1 \times 10^{-3}$ | $1 \times 10^{-3}$ | $1 \times 10^{-3}$ | $1 \times 10^{-3}$ |
| | | $NH_3$ atm | 0.1 | 0.1 | 0.1 | 0.1 |
| | | TIME min | 60 | 60 | 60 | 60 |
| | | THICKNESS nm | 60 | 60 | 60 | 60 |
| | EPITAXIAL LAYER | TEMPERATURE °C. | 1030 | 1030 | 1030 | 1030 |
| | | HCl atm | $3 \times 10^{-2}$ | $3 \times 10^{-2}$ | $3 \times 10^{-2}$ | $3 \times 10^{-2}$ |
| | | $NH_3$ atm | 0.2 | 0.2 | 0.2 | 0.2 |
| | | TIME min | 100 | 100 | 100 | 100 |
| | | THICKNESS nm | 10 | 10 | 10 | 10 |
| | | DOPANT | 0 (OXYGEN) | 0 (OXYGEN) | 0 (OXYGEN) | 0 (OXYGEN) |
| PRODUCT (GaN CRYSTAL) | | SIZE | | 2 | | |
| | | OFF DIRECTION [1-100] | | | | |
| | | OFF-ANGLE θa | 28.12 | 28.03 | 28.31 | 28.16 |
| | | OFF DIRECTION [11-20] | | | | |
| | | OFF-ANGLE θb | 0.02 | 0.05 | 5.02 | 10.02 |
| | | OFF-ANGLE IN-PLANE DISTRIBUTION Δθa | ±0.6 | ±0.6 | ±0.6 | ±0.6 |
| | | OFF-ANGLE IN-PLANE DISTRIBUTION Δθb | ±0.5 | ±0.5 | ±0.5 | ±0.5 |
| | | DISLOCATION DENSITY | 6.0E+05 | 6.0E+05 | 6.0E+05 | 6.0E+05 |
| | | Blue Shift (Δλ) | 4 | 5 | 4 | 4 |
| | | ΔVop (V) | 0.003 | 0.002 | 0.001 | 0.001 |
| | | 2-INCH IN-PLANE WAVELENGTH DISTRIBUTION σ | ±2.6 | ±2.0 | ±2.0 | ±1.9 |

TABLE 10

| SECTION | | | EXAMPLE 45 | EXAMPLE 46 | EXAMPLE 47 | EXAMPLE 48 |
|---|---|---|---|---|---|---|
| | | SAMPLE ID | | | | |
| BASE SUBSTRATE | | MATERIAL | | GaAs | | |
| | | SIZE (INCH) | | 2 | | |
| | | OFF DIRECTION <1-10> → CORRESPONDING OFF DIRECTION [11-20] IN GaN | | | | |
| | | OFF-ANGLE θ1 | 0.03 | 0.05 | 5 | 10 |
| | | OFF DIRECTION <11-2> → CORRESPONDING OFF DIRECTION [1-100] IN GaN | | | | |
| | | OFF-ANGLE θ2 | 28 | 28 | 28 | 28 |
| | | MASK CONFIGURATION | STRIPE | STRIPE | STRIPE | STRIPE |
| | | INTERVAL (μm) | 500 | 500 | 500 | 500 |
| GROWTH CONDITION | BUFFER LAYER | TEMPERATURE °C. | 500 | 500 | 500 | 500 |
| | | HCl atm | $1 \times 10^{-3}$ | $1 \times 10^{-3}$ | $1 \times 10^{-3}$ | $1 \times 10^{-3}$ |
| | | $NH_3$ atm | 0.1 | 0.1 | 0.1 | 0.1 |
| | | TIME min | 60 | 60 | 60 | 60 |
| | | THICKNESS nm | 60 | 60 | 60 | 60 |
| | EPITAXIAL LAYER | TEMPERATURE °C. | 1030 | 1030 | 1030 | 1030 |
| | | HCl atm | $3 \times 10^{-2}$ | $3 \times 10^{-2}$ | $3 \times 10^{-2}$ | $3 \times 10^{-2}$ |
| | | $NH_3$ atm | 0.2 | 0.2 | 0.2 | 0.2 |
| | | TIME min | 100 | 100 | 100 | 100 |
| | | THICKNESS nm | 10 | 10 | 10 | 10 |
| | | DOPANT | 0 (OXYGEN) | 0 (OXYGEN) | 0 (OXYGEN) | 0 (OXYGEN) |
| PRODUCT (GaN CRYSTAL) | | SIZE | | 2 | | |
| | | OFF DIRECTION [1-100] | | | | |
| | | OFF-ANGLE θa | 0.02 | 0.05 | 4.99 | 10.10 |
| | | OFF DIRECTION [11-20] | | | | |
| | | OFF-ANGLE θb | 27.80 | 27.55 | 28.16 | 28.04 |
| | | OFF-ANGLE IN-PLANE DISTRIBUTION Δθa | ±0.6 | ±0.6 | ±0.6 | ±0.6 |
| | | OFF-ANGLE IN-PLANE DISTRIBUTION Δθb | ±0.5 | ±0.5 | ±0.5 | ±0.5 |
| | | DISLOCATION DENSITY | 6.0E+05 | 6.0E+05 | 6.0E+05 | 6.0E+05 |
| | | Blue Shift (Δλ) | 4 | 5 | 4 | 4 |
| | | ΔVop (V) | 0.003 | 0.002 | 0.001 | 0.001 |
| | | 2-INCH IN-PLANE WAVELENGTH DISTRIBUTION σ | ±3 | ±2.8 | ±2.3 | ±2.2 |

Tables 9 and 10 show the measurement results when one of the off-angles θ1 and θ2 of the base substrate was fixed to 28°, and the other was 0.02° to 10°(that is, one of the off-angles θa and θb of the GaN substrate was fixed to about 28°, and the other was 0.02° to 10°).

TABLE 11

| | SECTION SAMPLE ID | EXAMPLE 49 | EXAMPLE 50 | EXAMPLE 51 | EXAMPLE 52 |
|---|---|---|---|---|---|
| BASE SUBSTRATE | MATERIAL | GaAs | | | |
| | SIZE (INCH) | 2 | | | |
| | OFF DIRECTION <1-10> → CORRESPONDING OFF DIRECTION [11-20] IN GaN OFF-ANGLE θ1 | 40 | 40 | 40 | 40 |
| | OFF DIRECTION <11-2> → CORRESPONDING OFF DIRECTION [1-100] IN GaN OFF-ANGLE θ2 | 0.03 | 0.05 | 5 | 10 |
| | MASK CONFIGURATION | STRIPE | STRIPE | STRIPE | STRIPE |
| | INTERVAL (μm) | 500 | 500 | 500 | 500 |
| GROWTH CONDITION | BUFFER LAYER TEMPERATURE ° C. | 500 | 500 | 500 | 500 |
| | HCl atm | $1 \times 10^{-3}$ | $1 \times 10^{-3}$ | $1 \times 10^{-3}$ | $1 \times 10^{-3}$ |
| | $NH_3$ atm | 0.1 | 0.1 | 0.1 | 0.1 |
| | TIME min | 60 | 60 | 60 | 60 |
| | THICKNESS nm | 60 | 60 | 60 | 60 |
| | EPITAXIAL LAYER TEMPERATURE ° C. | 1030 | 1030 | 1030 | 1030 |
| | HCl atm | $3 \times 10^{-2}$ | $3 \times 10^{-2}$ | $3 \times 10^{-2}$ | $3 \times 10^{-2}$ |
| | $NH_3$ atm | 0.2 | 0.2 | 0.2 | 0.2 |
| | TIME min | 100 | 100 | 100 | 100 |
| | THICKNESS nm | 10 | 10 | 10 | 10 |
| | DOPANT | 0 (OXYGEN) | 0 (OXYGEN) | 0 (OXYGEN) | 0 (OXYGEN) |
| PRODUCT (GaN CRYSTAL) | SIZE | 2 | | | |
| | OFF DIRECTION [1-100] OFF-ANGLE θa | 39.81 | 40.13 | 39.88 | 39.88 |
| | OFF DIRECTION [11-20] OFF-ANGLE θb | 0.02 | 0.05 | 5.02 | 10.02 |
| | OFF-ANGLE IN-PLANE DISTRIBUTION Δθa | ±0.6 | ±0.6 | ±0.6 | ±0.6 |
| | OFF-ANGLE IN-PLANE DISTRIBUTION Δθb | ±0.5 | ±0.5 | ±0.5 | ±0.5 |
| | DISLOCATION DENSITY | 6.0E+05 | 6.0E+05 | 6.0E+05 | 6.0E+05 |
| | Blue Shift (Δλ) | 4 | 4 | 4 | 4 |
| | ΔVop (V) | 0.005 | 0.002 | 0.005 | 0.005 |
| | 2-INCH IN-PLANE WAVELENGTH DISTRIBUTION σ | ±2.6 | ±2.9 | ±2.0 | ±2.1 |

TABLE 12

| | SECTION SAMPLE ID | EXAMPLE 53 | EXAMPLE 54 | EXAMPLE 55 | EXAMPLE 56 |
|---|---|---|---|---|---|
| BASE SUBSTRATE | MATERIAL | GaAs | | | |
| | SIZE (INCH) | 2 | | | |
| | OFF DIRECTION <1-10> → CORRESPONDING OFF DIRECTION [11-20] IN GaN OFF-ANGLE θ1 | 0.03 | 0.05 | 5 | 10 |
| | OFF DIRECTION <11-2> → CORRESPONDING OFF DIRECTION [1-100] IN GaN OFF-ANGLE θ2 | 40 | 40 | 40 | 40 |
| | MASK CONFIGURATION | STRIPE | STRIPE | STRIPE | STRIPE |
| | INTERVAL (μm) | 500 | 500 | 500 | 500 |
| GROWTH CONDITION | BUFFER LAYER TEMPERATURE ° C. | 500 | 500 | 500 | 500 |
| | HCl atm | $1 \times 10^{-3}$ | $1 \times 10^{-3}$ | $1 \times 10^{-3}$ | $1 \times 10^{-3}$ |
| | $NH_3$ atm | 0.1 | 0.1 | 0.1 | 0.1 |
| | TIME min | 60 | 60 | 60 | 60 |
| | THICKNESS nm | 60 | 60 | 60 | 60 |
| | EPITAXIAL LAYER TEMPERATURE ° C. | 1030 | 1030 | 1030 | 1030 |
| | HCl atm | $3 \times 10^{-2}$ | $3 \times 10^{-2}$ | $3 \times 10^{-2}$ | $3 \times 10^{-2}$ |
| | $NH_3$ atm | 0.2 | 0.2 | 0.2 | 0.2 |
| | TIME min | 100 | 100 | 100 | 100 |
| | THICKNESS nm | 10 | 10 | 10 | 10 |
| | DOPANT | 0 (OXYGEN) | 0 (OXYGEN) | 0 (OXYGEN) | 0 (OXYGEN) |
| PRODUCT (GaN CRYSTAL) | SIZE | 2 | | | |
| | OFF DIRECTION [1-100] OFF-ANGLE θa | 0.02 | 0.05 | 4.99 | 10.01 |
| | OFF DIRECTION [11-20] OFF-ANGLE θb | 39.89 | 39.86 | 39.91 | 39.94 |
| | OFF-ANGLE IN-PLANE DISTRIBUTION Δθa | ±0.6 | ±0.6 | ±0.6 | ±0.6 |
| | OFF-ANGLE IN-PLANE DISTRIBUTION Δθb | ±0.5 | ±0.5 | ±0.5 | ±0.5 |
| | DISLOCATION DENSITY | 6.0E+05 | 6.0E+05 | 6.0E+05 | 6.0E+05 |
| | Blue Shift (Δλ) | 3 | 3 | 4 | 4 |
| | ΔVop (V) | 0.005 | 0.003 | 0.005 | 0.005 |
| | 2-INCH IN-PLANE WAVELENGTH DISTRIBUTION σ | ±2.7 | ±3.0 | ±2.0 | ±2.1 |

Tables 11 and 12 show the measurement results when one of the off-angles θ1 and θ2 of the base substrate was fixed to 40°, and the other was 0.02° to 10°(that is, one of the off-angles θa and θb of the GaN substrate was fixed to about 40°, and the other was 0.02° to 10°).

TABLE 13

| SECTION | | | EXAMPLE 57 | EXAMPLE 58 | EXAMPLE 59 | EXAMPLE 60 |
|---|---|---|---|---|---|---|
| | | SAMPLE ID | | | | |
| BASE SUBSTRATE | | MATERIAL | GaAs | | | |
| | | SIZE (INCH) | 2 | | | |
| | | OFF DIRECTION <1-10> → CORRESPONDING OFF DIRECTION [11-20] IN GaN | | | | |
| | | OFF-ANGLE θ1 | 26 | 26 | 40 | 40 |
| | | OFF DIRECTION <11-2> → CORRESPONDING OFF DIRECTION [1-100] IN GaN | | | | |
| | | OFF-ANGLE θ2 | 26 | 40 | 26 | 40 |
| | | MASK CONFIGURATION | STRIPE | STRIPE | STRIPE | STRIPE |
| | | INTERVAL (μm) | 500 | 500 | 500 | 500 |
| GROWTH CONDITION | BUFFER LAYER | TEMPERATURE ° C. | 500 | 500 | 500 | 500 |
| | | HCl atm | $1 \times 10^{-3}$ | $1 \times 10^{-3}$ | $1 \times 10^{-3}$ | $1 \times 10^{-3}$ |
| | | $NH_3$ atm | 0.1 | 0.1 | 0.1 | 0.1 |
| | | TIME min | 60 | 60 | 60 | 60 |
| | | THICKNESS nm | 60 | 60 | 60 | 60 |
| | EPITAXIAL LAYER | TEMPERATURE ° C. | 1030 | 1030 | 1030 | 1030 |
| | | HCl atm | $3 \times 10^{-2}$ | $3 \times 10^{-2}$ | $3 \times 10^{-2}$ | $3 \times 10^{-2}$ |
| | | $NH_3$ atm | 0.2 | 0.2 | 0.2 | 0.2 |
| | | TIME min | 100 | 100 | 100 | 100 |
| | | THICKNESS nm | 10 | 10 | 10 | 10 |
| | | DOPANT | Si | Si | Si | Si |
| PRODUCT (GaN CRYSTAL) | | SIZE | 2 | | | |
| | | OFF DIRECTION [1-100] | | | | |
| | | OFF-ANGLE θa | 25.85 | 26.06 | 40.08 | 40.04 |
| | | OFF DIRECTION [11-20] | | | | |
| | | OFF-ANGLE θb | 25.93 | 39.78 | 25.98 | 40.02 |
| | | OFF-ANGLE IN-PLANE DISTRIBUTION Δθa | ±0.6 | ±0.6 | ±0.6 | ±0.6 |
| | | OFF-ANGLE IN-PLANE DISTRIBUTION Δθb | ±0.5 | ±0.5 | ±0.5 | ±0.5 |
| | | DISLOCATION DENSITY | 6.0E+05 | 6.0E+05 | 6.0E+05 | 6.0E+05 |
| | | Blue Shift (Δλ) | 4 | 4 | 3 | 3 |
| | | ΔVop (V) | 0.003 | 0.003 | 0.003 | 0.003 |
| | | 2-INCH IN-PLANE WAVELENGTH DISTRIBUTION σ | ±2.7 | ±2.7 | ±2.5 | ±2.7 |

TABLE 14

| SECTION | | | COMPARISON EXAMPLE 4 | COMPARISON EXAMPLE 5 |
|---|---|---|---|---|
| | | SAMPLE ID | | |
| BASE SUBSTRATE | | MATERIAL | GaAs | |
| | | SIZE (INCH) | 2 | |
| | | OFF DIRECTION <1-10> → CORRESPONDING OFF DIRECTION [11-20] IN GaN | | |
| | | OFF-ANGLE θ1 | 40 | 45 |
| | | OFF DIRECTION <11-2> → CORRESPONDING OFF DIRECTION [1-100] IN GaN | | |
| | | OFF-ANGLE θ2 | 45 | 40 |
| | | MASK CONFIGURATION | STRIPE | STRIPE |
| | | INTERVAL (μm) | 500 | 500 |
| GROWTH CONDITION | BUFFER LAYER | TEMPERATURE ° C. | 500 | 500 |
| | | HCl atm | $1 \times 10^{-3}$ | $1 \times 10^{-3}$ |
| | | $NH_3$ atm | 0.1 | 0.1 |
| | | TIME min | 60 | 60 |
| | | THICKNESS nm | 60 | 60 |
| | EPITAXIAL LAYER | TEMPERATURE ° C. | 1030 | 1030 |
| | | HCl atm | $3 \times 10^{-2}$ | $3 \times 10^{-2}$ |
| | | $NH_3$ atm | 0.2 | 0.2 |
| | | TIME min | 100 | 100 |
| | | THICKNESS nm | 10 | 10 |
| | | DOPANT | Si | Si |
| PRODUCT (GaN CRYSTAL) | | SIZE | 2 | |
| | | OFF DIRECTION [1-100] | | |
| | | OFF-ANGLE θa | POLYCRYSTALLIZED | POLYCRYSTALLIZED |

TABLE 14-continued

| SECTION SAMPLE ID | COMPARISON EXAMPLE 4 | COMPARISON EXAMPLE 5 |
|---|---|---|
| OFF DIRECTION [11-20] OFF-ANGLE θb | POLYCRYSTALLIZED | POLYCRYSTALLIZED |
| OFF-ANGLE IN-PLANE DISTRIBUTION Δθa | POLYCRYSTALLIZED | POLYCRYSTALLIZED |
| OFF-ANGLE IN-PLANE DISTRIBUTION Δθb | POLYCRYSTALLIZED | POLYCRYSTALLIZED |
| DISLOCATION DENSITY | POLYCRYSTALLIZED | POLYCRYSTALLIZED |
| Blue Shift (Δλ) | — | — |
| ΔVop (V) | — | — |
| 2-INCH IN-PLANE WAVELENGTH DISTRIBUTION σ | — | — |

Tables 13 and 14 show the measurement results when the off-angles θ1 and θ2 of the base substrate were changed within a range of 26° to 45°(specifically, 26°, 40°, and 45°) (that is, the off-angles θa and θb of the GaN substrate were changed within a range of 26° to 45°). As can be seen from table 14, when either one of the off-angle θ1 or θ2 of the base substrate was set at 40° or more (specifically 45°), the GaN crystal layer was not formed. Meanwhile, when the off-angles θ1 and θ2 of the base substrate was set at 40° or less (that is, when the off-angles θa and θb of the GaN crystal layer were set at 40° or less), the off-angle in-plane distributions Δθa and Δθb, the increased amount of the operation voltage (ΔVop), and the in-plane wavelength distribution (σ) of the GaN substrate were smaller than those of the samples of comparison examples and Examples shown in tables 1 and 2.

According to the samples of the Example shown in tables 3 to 14 (more specifically, the samples in which one of the off-angles θa and θb of the GaN substrate was 10° to 40°, and the other was 0.02° to 40°), the off-angle in-plane distributions Δθa and Δθb, the increased amount of the operation voltage (ΔVop), and the in-plan wavelength distribution (σ) of the GaN substrate were smaller than those of the samples of comparison examples and Examples shown in tables 1 and 2.

TABLE 15

| | SECTION SAMPLE ID | | EXAMPLE 61 | EXAMPLE 62 | EXAMPLE 63 | EXAMPLE 64 | EXAMPLE 65 |
|---|---|---|---|---|---|---|---|
| BASE SUBSTRATE | | MATERIAL | Sap. | Sap. | ZnO | SiC | GaN (GaN SUBSTRATE PROVIDED IN EXAMPLE 57) |
| | | SIZE (INCH) | | | 2 | | |
| | | CORRESPONDING OFF DIRECTION [1-100] IN GaN OFF-ANGLE θ1 | 26 | 40 | 26 | 26 | 26 |
| | | CORRESPONDING OFF DIRECTION [11-20] IN GaN OFF-ANGLE θ2 | 26 | 40 | 26 | 26 | 26 |
| | | MASK CONFIGURATION | STRIPE | STRIPE | STRIPE | STRIPE | STRIPE |
| | | INTERVAL (μm) | 500 | 500 | 500 | 500 | 500 |
| GROWTH CONDITION | BUFFER LAYER | TEMPERATURE ° C. | 500 | 500 | 500 | 500 | — |
| | | HCl atm | $1 \times 10^{-3}$ | $1 \times 10^{-4}$ | $1 \times 10^{-5}$ | $1 \times 10^{-6}$ | — |
| | | NH$_3$ atm | 0.1 | 0.1 | 0.1 | 0.1 | — |
| | | TIME min | 60 | 60 | 60 | 60 | — |
| | | THICKNESS nm | 60 | 60 | 60 | 60 | — |
| | EPITAXIAL LAYER | TEMPERATURE ° C. | 1030 | 1030 | 1030 | 1030 | 1030 |
| | | HCl atm | $3 \times 10^{-2}$ | $3 \times 10^{-2}$ | $3 \times 10^{-2}$ | $3 \times 10^{-2}$ | $3 \times 10^{-2}$ |
| | | NH$_3$ atm | 0.2 | 0.2 | 0.2 | 0.2 | 0.2 |
| | | TIME min | 100 | 100 | 100 | 100 | 100 |
| | | THICKNESS nm | 10 | 10 | 10 | 10 | 10 |
| | | DOPANT | Si | Si | Si | Si | Si |
| PRODUCT (GaN CRYSTAL) | | SIZE | | | 2 | | |
| | | OFF DIRECTION [1-100] OFF-ANGLE θa | 26.03 | 39.94 | 26.05 | 25.95 | 26.05 |
| | | OFF DIRECTION [11-20] OFF-ANGLE θb | 25.98 | 40.02 | 26.03 | 25.91 | 25.88 |
| | | OFF-ANGLE IN-PLANE DISTRIBUTION Δθa | ±0.6 | ±0.6 | ±0.6 | ±0.6 | ±0.6 |
| | | OFF-ANGLE IN-PLANE DISTRIBUTION Δθb | ±0.5 | ±0.5 | ±0.5 | ±0.5 | ±0.5 |
| | | DISLOCATION DENSITY | 6.0E+05 | 6.0E+05 | 6.0E+05 | 6.0E+05 | 2.0E+06 |
| | | Blue Shift (Δλ) | 5 | 5 | 5 | 4 | 4 |
| | | ΔVop (V) | 0.004 | 0.005 | 0.005 | 0.005 | 0.003 |
| | | 2-INCH IN-PLANE WAVELENGTH DISTRIBUTION σ | ±2.8 | ±2.8 | ±2.4 | ±2.1 | ±2.2 |

TABLE 16

| | SECTION | EXAMPLE |
|---|---|---|
| | SAMPLE ID | 66 |
| BASE SUBSTRATE | MATERIAL | Sap. |
| | SIZE (INCH) | 2 |
| | CORRESPONDING OFF DIRECTION [1-100] IN GaN OFF-ANGLE θ1 | 26 |
| | CORRESPONDING OFF DIRECTION [11-20] IN GaN OFF-ANGLE θ2 | 26 |
| | MASK CONFIGURATION | DOT |
| | INTERVAL (μm) | 500 |
| GROWTH CONDITION — BUFFER LAYER | TEMPERATURE ° C. | 500 |
| | HCl atm | $1 \times 10^{-3}$ |
| | NH$_3$ atm | 0.1 |
| | TIME min | 60 |
| | THICKNESS nm | 60 |
| EPITAXIAL LAYER | TEMPERATURE ° C. | 1030 |
| | HCl atm | $3 \times 10^{-2}$ |
| | NH$_3$ atm | 0.2 |
| | TIME min | 100 |
| | THICKNESS nm | 10 |
| | DOPANT | Si |
| PRODUCT (GaN CRYSTAL) | SIZE | 2 |
| | OFF DIRECTION [1-100] OFF-ANGLE θa | 26.03 |
| | OFF DIRECTION [11-20] OFF-ANGLE θb | 25.98 |
| | OFF-ANGLE IN-PLANE DISTRIBUTION Δθa | ±0.6 |
| | OFF-ANGLE IN-PLANE DISTRIBUTION Δθb | ±0.5 |
| | DISLOCATION DENSITY | 8.0E+05 |
| | Blue Shift (Δλ) | 5 |
| | ΔVop (V) | 0.006 |
| | 2-INCH IN-PLANE WAVELENGTH DISTRIBUTION σ | ±2.8 |

Tables 15 and 16 show the film formation conditions of GaN and the measurement results of the samples using a substrate formed of a material other than GaAs as a base substrate. As can be seen from the measurement results of samples ID61 to 66, even when the substrate (sapphire substrate, ZnO substrate, SiC substrate, or GaN substrate) other than the GaAs substrate was used as the base substrate, the GaN substrate in which the plane direction [0001] is inclined in two off-angle directions can be manufactured similar to the case where a GaAs substrate is used as the base substrate. The provided GaN substrate and the light emitting element manufactured with the GaN substrate show the same characteristics as the GaN substrate manufactured with the GaAs substrate as the base substrate and the light emitting element manufactured with the GaN substrate. Not that the GaN substrate manufactured using the sapphire substrate, ZnO substrate, SiC substrate, or GaN substrate having the same off-angle as that of GaAs, and the light emitting element manufactured with the GaN substrate show the same characteristics as those shown in tables 1 to 14 although they are not shown in the tables.

In addition, in sample ID66 of the Example, since the mask layer formed on the main surface of the base substrate was in the form of dots, the defect concentrated region as shown in FIG. 3 was formed on the dot-shaped mask layer on the formed GaN substrate, and the low-defect crystal region was formed around the defect concentrated region. With respect to each sample described above, the light emitting element was formed making use of the low-defect crystal region.

Example 3

The following measurement was made on the GaN substrate according to the present invention.

(1) Preparation of GaN Substrate

The GaN substrates of samples ID25 and ID41 of the Example were prepared. The manufacturing method of the GaN substrate was the same as that shown in Example 2. In addition, in the GaN substrate of sample ID25, the off-angle θ1 in [11-20] direction of the base substrate (GaAs substrate) was 18°(refer to table 5). In addition, in the GaN substrate of sample ID41, the off-angle θ1 in [11-20] direction of the base substrate (GaAs substrate) was 28°(refer to table 9).

(2) Measurement

Figure 14:
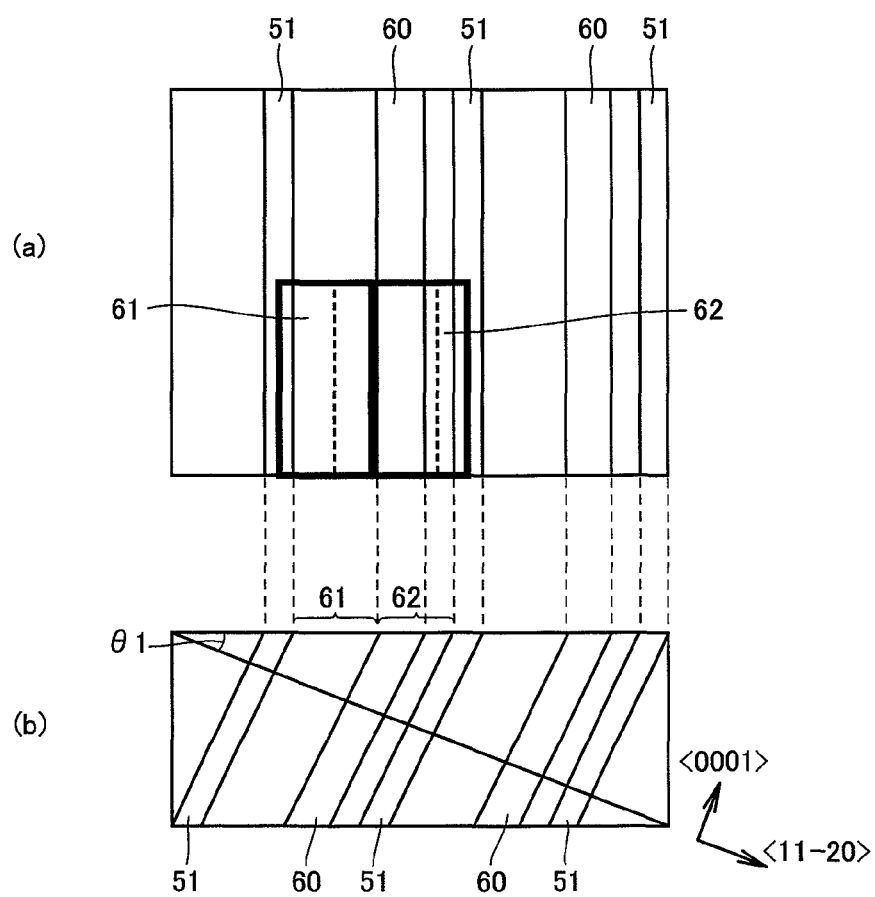
FIG. 14 is a schematic view showing a GaN substrate to be measured.

The dislocation densities of the GaN substrates of samples ID25 and 41 were measured by a CL (cathode luminescence) method. According to the measurement method, the number of defects observed as dark points in the surface of the GaN substrate was measured by using the CL mounted on a SEM (Scanning Electron Microscope). As shown in FIG. 14, measurement positions were set at a region 62 on the GaN off-direction side (region on the side in which the plane direction [0001] of GaN is inclined (downstream side) between the adjacent defect concentrated regions 51) and a region 61 on the opposite side of the GaN off-direction (region on the opposite side of the side in which the plane direction [0001] of GaN is inclined (upstream side) between the adjacent defect concentrated regions 51), between the adjacent defect concentrated regions 51 on the plane of the GaN substrate, and the number of defects observed as dark points in an area of 50

μm×50 μm was measured. FIG. 14 is a schematic view showing the GaN substrate to be measured as described above, in which FIG. 14(a) is a plane schematic view showing the GaN substrate, and FIG. 14(b) is a corresponding cross-sectional schematic view. As shown in FIG. 14, defect concentrated regions 51 extending linearly are disposed on the plane of the GaN substrate. These defect concentrated regions extend parallel to one another. In addition, as shown in FIG. 14(b), defect concentrated regions 51 extend so as to be inclined with respect to the main surface of the GaN substrate in the thickness direction of the GaN substrate.

In addition, a C-plane growth part 60 is disposed between adjacent defect concentrated regions 51. C-plane growth part 60 is a region grown while keeping the C-plane and can be observed as a bright portion when observed with a fluorescence microscope. C-plane growth part 60 is formed so as to extend along defect concentrated regions 51.

(3) Measurement Result

As a result of measurement, when the defect density of region 62 on the GaN off-direction side was compared with that of region 61 on the opposite side of the GaN off-direction, it was found that the defect density of region 62 on the GaN off-direction side was smaller than that of region 61 on the opposite side of the GaN off-direction. More specifically, regarding the GaN substrate of sample ID 25, while the defect density of measurement data of region 62 on the off-direction side (defect density data at a region apart from defect concentrated region 51 by 100 μm) was $1.6 \times 10^5/cm^2$, the defect density of measurement data of region 61 on the opposite side of the off-direction (defect density data at a region apart from defect concentrated region 51 by 100 μm) was $4.2 \times 10^5/cm^2$.

In addition, regarding the GaN substrate of sample ID41, while the defect density of measurement data of region 62 on the off-direction side (defect density data at a region apart from defect concentrated region 51 by 100 μm) was $1.1 \times 10^5/cm^2$, the defect density of measurement data of region 61 on the opposite side of the off-direction (defect density data at a region apart from defect concentrated region 51 by 100 μm) was $6.2 \times 10^5/cm^2$.

Example 4

With the GaN substrates of samples ID25 and ID41 as the measurement targets in Example 3, a laser dialed (LD) was formed and the operating life test was performed on the LD as will be described below.

(1) Sample

Figure 15:
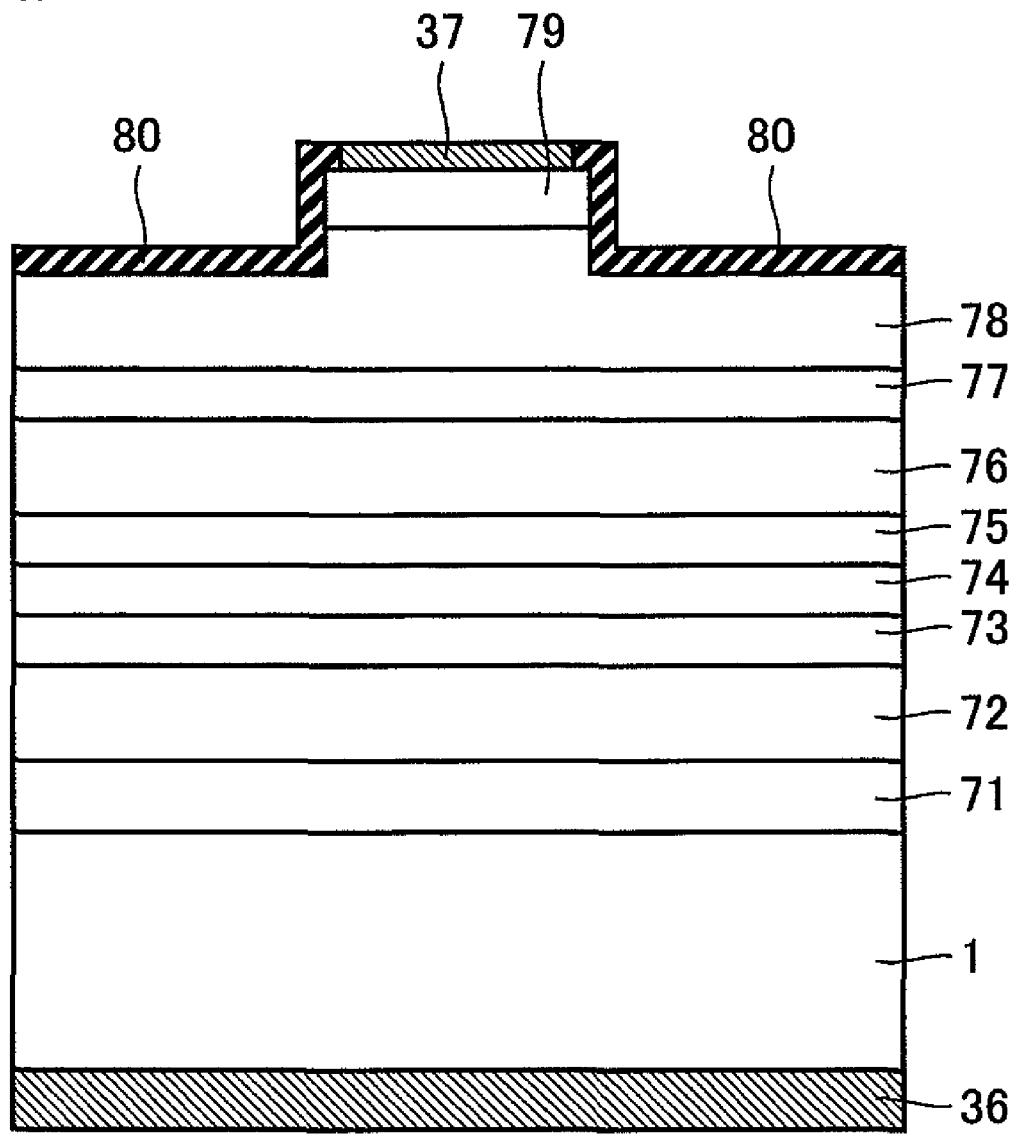
FIG. 15 is a cross-sectional schematic view showing the constitution of a laser diode (LD) formed in Example 4.

An LD was formed as shown in FIG. 15 with the GaN substrates of samples ID25 and ID41. The measurement method is as follows. FIG. 15 is a cross-sectional schematic view showing the constitution of the laser diode (LD) formed in Example 4.

A group-III nitride semiconductor layer was epitaxially grown on the plane of GaN substrate 1 (refer to FIG. 15) having a thickness of 400 μm (GaN substrate of sample ID25 and sample ID41) by the MOCVD method. More specifically, as to the group-III nitride semiconductor layer, an n-type GaN buffer layer 71 (refer to FIG. 15) doped with Si and having a thickness of 0.05 μm was formed on the plane of the GaN substrate first. An n-type $Al_{0.08}Ga_{0.92}N$ clad layer 72 (refer to FIG. 15) doped with Si and having a thickness of 1.0 μm was formed on the n-type GaN buffer layer. An n-type GaN light waveguide layer 73 (refer to FIG. 15) doped with Si and a thickness of 0.1 μm was formed on the n-type AlGaN clad layer 72. An active layer 74 (refer to FIG. 15) having a multiple quantum well structure in which undoped $In_{0.15}Ga_{0.85}N$ layer having a thickness of 3 nm and a $In_{0.03}Ga_{0.97}N$ layer having a thickness of 6 nm were repeated five times was formed on n-type GaN light waveguide layer 73. An undoped $Al_{0.2}Ga_{0.8}N$ deterioration preventive layer 75 (refer to FIG. 15) having a thickness of 0.01 μm was formed on active layer 74. A p-type $Al_{0.2}Ga_{0.8}N$ cap layer 76 (refer to FIG. 15) doped with magnesium (Mg) and having a thickness of 10 nm was formed on AlGaN deterioration preventive layer 75. A p-type GaN light waveguide layer 77 (refer to FIG. 15) doped with Mg and having a thickness of 0.1 μm was formed on p-type AlGaN cap layer 76. A p-type $Al_{0.08}Ga_{0.92}N$ clad layer 78 doped with Mg and having a thickness of 0.3 μm was formed on p-type GaN light waveguide layer 77. A p-type GaN contact layer 79 doped with Mg was formed on p-type AlGaN clad layer 78.

Thus, after the group-III nitride semiconductor layers were sequentially epitaxially grown, the GaN substrate was taken out of the MOCVD apparatus. Then, a $SiO_2$ film having a thickness of 0.1 μm was formed as an insulation film on the entire upper plane of p-type GaN contact layer 79 by a CVD method. Then, a pattern corresponding to a ridge portion was formed on the $SiO_2$ film by lithography.

The ridge portion was patterned so that it can be formed at each of region 62 on the GaN off-direction side and region 61 on the opposite side of the GaN off-direction across a bright portion (C-plane growth part 60) observed with the fluorescence microscope, as shown in FIG. 14.

Then, p-type AlGaN clad layer 78 was etched away to a predetermined depth in the thickness direction by an RIE method through a mask of the $SiO_2$ film, whereby the ridge extending in <1-100> direction was formed. The width of the ridge was 2 μm. Chlorine gas was used as the etching gas in the RIE method.

Then, the $SiO_2$ film used as the etching mask for forming the ridge was removed by etching, and then, an $SiO_2$ film 80 (refer to FIG. 15) having a thickness of 0.3 μm was formed by the CVD method as an insulation film on the entire substrate plane. Then, a resist pattern covering the plane of $SiO_2$ film 80 except a p-electrode formation region was formed by lithography. $SiO_2$ film 80 was etched through a mask of this resist pattern, whereby a p-electrode opening in which a p-electrode was to be formed was formed in $SiO_2$ film 80.

Then, with the resist pattern left as it is, a metal film to become the p-electrode was formed on the entire substrate by a vacuum deposition method, and then, the metal film formed on the resist pattern was removed (lifted off) together with the resist pattern. As a result, a p-electrode 37 (refer to FIG. 15) was formed on p-type GaN contact layer 79 only.

Furthermore, in order to make it easier to separate the laser diode into chips, the substrate plane on the side of the p-type GaN contact layer 79 was attached to a polishing holder, and the back surface of GaN substrate (plane on the opposite side of the main surface on which the group-III nitride semiconductor layer was formed) was polished with a slurry containing an SiC abrasive grain having an average grain diameter of 30 μm. In this polishing step, the GaN substrate was polished until the thickness is reduced from 400 μm to 100 μm.

Then, an n-electrode 36 (refer to FIG. 15) was formed on the back surface of the GaN substrate. Then, the GaN substrate having a laser structure formed as described above was scribed along cleavage following the outline of the element region and processed into a bar shape. As a result, a pair of resonator end planes was formed in the bar-shaped chip aggregate (chip array). Then, the resonator end planes are coated, and the chip array (laser bar) was scribed along cleavage again, and the laser diode was divided into individual chips (processed into chips). Thus, the laser diodes shown in FIG. 15 were provided.

The provided laser diodes are grouped into a laser diode (sample group A) in which the ridge portion was formed in region 62 on the GaN off-direction side across C-plane growth part 60 and a laser diode (sample group B) in which the ridge portion was formed in region 61 on the opposite side of the GaN off-direction across C-plane growth part 60.

(2) Measurement

The operating life test was performed on the provided laser diodes. More specifically, laser was oscillated under the condition that an ambient temperature was 90° C. and a light output was 10 mW (low output LD test) and a light output was 100 mW (high output LD test), and a time taken for a current value at the time of the drive of a constant light output to become 1.2 times was measured. Thus, when the time was three thousand hours or more, the LD passed the test.

(3) Measurement Result

According to the result of the laser oscillation under the condition that the light output was 10 mW (low output LD test), the pass rates of both the laser diode (LD) chip (sample group A) in which the ridge was formed in region 62 (refer to FIG. 14) on the GaN off-direction side and the LD chip (sample group B) in which the ridge was formed in region 61 (refer to FIG. 14) on the opposite side of the GaN off-direction were 85% or more.

Then, according to the result of the laser oscillation under the condition that the light output was 100 mW (high output LD test), while the pass rate of the LD chip (sample group A) in which the ridge was formed in region 62 (refer to FIG. 14) on the GaN off-direction side was 82%, the pass rate of the LD chip (sample group B) in which the ridge was formed in region 61 (refer to FIG. 14) on the opposite side of the GaN off-direction was 61%.

In addition, the inventor also made the LDs in a region on the off-direction side and a region on the opposite side of the off-direction with the GaN substrate of the samples according to the other Examples and performed the test to find that the pass rate of LD chip made on the off-direction side was high all the time. Therefore, when a plurality of LD chips are formed between defect concentrated regions 51, the high output LD is to be formed in region 62 on the off-direction side and the low output LD is to be formed in region 61 on the opposite side of the off-direction. When one LD chip is formed between defect concentrated regions 51, the LD shows favorable characteristics when the ridge of the LD is formed in region 62 on the off-direction side.

Note that the region on the off-direction side means the region on the off-angle direction side when the plane direction [0001] of the GaN substrate is inclined, between adjacent defect concentrated regions 51 in the GaN substrate, that is, for example, the region on the off-angle direction side with respect to a center portion in the off-angle direction (inclined side of the plane direction [0001]) between adjacent defect concentrated regions 51. In addition, the region on the opposite side of the off-direction means the region on the opposite side of the off-angle direction in which the plane direction [0001] of the GaN substrate is inclined, between adjacent defect concentrated regions 51 in the GaN substrate, that is, for example, the region on the opposite side of the off-angle direction with respect to the center portion in the off-angel direction (opposite side of the inclined side of the plane direction [0001]) between defect concentrated regions 51. In addition, the region on the opposite side of the off-direction can be regarded as the region on the opposite side of the region on the off-direction side between adjacent defect concentrated regions 51. In addition, more preferably, the region on the off-angle direction side with respect to C-plane growth part 60 (refer to FIG. 14) between adjacent defect concentrated regions 51 is used as the region in which the ridge is formed. Meanwhile, the region on the opposite side of the off-angle direction with respect to C-plane growth part 60 (refer to FIG. 14) between adjacent defect concentrated regions 51 may be used for the low output LD.

The present invention can be advantageously applied to the GaN substrate used in the light emitting element emitting light having a relatively long wavelength (wavelength region of 500 nm or more), the substrate with an epitaxial layer in which the epitaxial layer is formed on the plane of the GaN substrate, and the semiconductor device using the GaN substrate.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A method of manufacturing a GaN substrate comprising the steps of:
    preparing a base substrate having a reference plane direction inclined in an inclined direction of said base substrate with respect to a normal vector of a main surface;
    forming a mask layer having a pattern on said main surface of said base substrate;
    growing a GaN crystal layer on said main surface of said base substrate on which said mask layer is formed; and
    providing a GaN substrate containing the GaN crystal layer by removing said base substrate from said GaN crystal layer, wherein
    said GaN substrate has a main surface, and a plane direction [0001] thereof is inclined in an off-angle direction with respect to a normal vector of said main surface, and
    an inclined angle in said off-angle direction of said plane direction [0001] in said GaN substrate is adjusted by changing an inclined angle of said reference plane direction in the inclined direction of said base substrate in said base substrate, wherein
    said reference plane direction is inclined in said two different inclined directions of said base substrate with respect to the normal vector of said main surface in the step of preparing said base substrate, and
    said plane direction [0001] is inclined in said two different off-angle directions with respect to the normal vector of said main surface in said GaN substrate, wherein
    one of inclined angles in said two inclined directions of said base substrate in said base substrate is 10° to 40°, and the other is 0.02° to 40°, and wherein
    the two off-angle directions of said plane direction [0001] inclined with respect to the normal vector of the main surface are a [1-100] direction and a [11-20] direction.

2. The method according to claim 1 of manufacturing a GaN substrate, wherein
    said base substrate is a GaAs substrate,
    said reference plane direction is [111],
    said two inclined directions of said base substrate are a <1-10> direction and a <11-2> direction, and
    said two off-angle directions of said GaN substrate are a [11-20] direction and a [1-100] direction.

3. The method according to claim 1 of manufacturing a GaN substrate, wherein
    said base substrate is a sapphire substrate,
    said reference plane direction is [0001], said two inclined directions of said base substrate are a [11-20] direction and a [1-100] direction, and said two off-angle directions of said GaN substrate are a [1-100] direction and a [11-20] direction.

4. The method according to claim 1 of manufacturing a GaN substrate, wherein said base substrate is a ZnO substrate, said reference plane direction is [0001], said two inclined directions of said base substrate are a [1-100] direction and a [11-20] direction, and said two off-angle directions of said GaN substrate are a [1-100] direction and a [11-20] direction.

5. The method according to claim 1 of manufacturing a GaN substrate, wherein said base substrate is a SiC substrate, said reference plane direction is [0001], said two inclined directions of said base substrate are a [1-100] direction and a [11-20] direction, and said two off-angle directions of said GaN substrate are a [1-100] direction and a [11-20] direction.

6. The method according to claim 1 of manufacturing a GaN substrate, wherein said base substrate is a GaN-based substrate, said reference plane direction is [0001], said two inclined directions of said base substrate are a [1-100] direction and a [11-20] direction, and said two off-angle directions of said GaN substrate are a [1-100] direction and a [11-20] direction.

7. The method according to claim 1 of manufacturing a GaN substrate, wherein said pattern of said mask layer includes a plurality of linear portions extending parallel to one another at intervals.

8. The method according to claim 1 of manufacturing a GaN substrate, wherein said pattern of said mask layer includes a plurality of islands-like portions dispersed and disposed at intervals to one another.

* * * * *